(12) United States Patent
Shirai et al.

(10) Patent No.: US 8,928,071 B2
(45) Date of Patent: *Jan. 6, 2015

(54) SEMICONDUCTOR DEVICE INCLUDING A MOSFET AND SCHOTTKY JUNCTION

(71) Applicant: Renesas Electronics Corporation, Kawasaki-shi, Kanagawa (JP)

(72) Inventors: Nobuyuki Shirai, Takasaki (JP); Nobuyoshi Matsuura, Takasaki (JP); Yoshito Nakazawa, Isesaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/844,950

(22) Filed: Mar. 16, 2013

(65) Prior Publication Data

US 2013/0214378 A1 Aug. 22, 2013

Related U.S. Application Data

(63) Continuation of application No. 13/467,536, filed on May 9, 2012, now Pat. No. 8,426,910, which is a (Continued)

(30) Foreign Application Priority Data

Oct. 26, 2001 (JP) .................. 2001-329620

(51) Int. Cl.
*H01L 29/66* (2006.01)
*H01L 29/78* (2006.01)
(Continued)

(52) U.S. Cl.
CPC ........... *H01L 29/8725* (2013.01); *H01L 29/456* (2013.01); *H01L 29/7811* (2013.01);
(Continued)

(58) Field of Classification Search
CPC .............. H01L 29/872; H01L 29/7813; H01L 29/2003; H01L 29/0619; H01L 29/1095

USPC .................. 257/330, 332, E29.201, 331, 341, 257/E21.655

See application file for complete search history.

(56) References Cited

U.S. PATENT DOCUMENTS

| 4,589,004 A | 5/1986 | Yasuda et al. |
| 5,262,669 A | 11/1993 | Wakatabe et al. |

(Continued)

FOREIGN PATENT DOCUMENTS

| DE | 19958694 A1 | 6/2001 |
| JP | S57-162359 | 10/1982 |

(Continued)

OTHER PUBLICATIONS

Office Action issued Sep. 6, 2011, in Japanese Patent Application No. 2008-030549.

(Continued)

*Primary Examiner* — Andy Huynh
(74) *Attorney, Agent, or Firm* — Miles & Stockbridge P.C.

(57) ABSTRACT

A semiconductor device has a semiconductor substrate with a plurality of transistor cell regions. Each transistor cell region includes a plurality of trenches disposed in the semiconductor substrate, a well region between the plurality of trenches, and a source region of a MOSFET in the well region. A source electrode of the MOSFET is in contact with a top surface of the source region in each of the plurality of transistor cell regions. The source electrode is in contact with a part of a main surface of the semiconductor substrate so as to form a Schottky junction in a Schottky cell region disposed between the plurality of transistor cell regions. The Schottky junction is lower than a portion of the main surface between the Schottky junction and one of the transistor cell regions.

14 Claims, 20 Drawing Sheets

Related U.S. Application Data continuation of application No. 13/214,131, filed on Aug. 19, 2011, now Pat. No. 8,193,578, which is a continuation of application No. 12/901,929, filed on Oct. 11, 2010, now Pat. No. 8,008,714, which is a continuation of application No. 12/404,285, filed on Mar. 14, 2009, now Pat. No. 7,829,946, which is a continuation of application No. 11/482,765, filed on Jul. 10, 2006, now Pat. No. 7,518,208, which is a continuation of application No. 10/948,305, filed on Sep. 24, 2004, now Pat. No. 7,078,782, which is a continuation of application No. 10/269,970, filed on Oct. 15, 2002, now Pat. No. 6,806,548.

(51) Int. Cl.
*H01L 29/872* (2006.01)
*H01L 29/45* (2006.01)
*H01L 29/10* (2006.01)
*H01L 29/06* (2006.01)
*H01L 29/40* (2006.01)
*H01L 29/08* (2006.01)
*H01L 29/47* (2006.01)

(52) U.S. Cl.
CPC ........... *H01L 29/1095* (2013.01); *H01L 29/782* (2013.01); *H01L 29/872* (2013.01); *H01L 29/7802* (2013.01); *H01L 29/0615* (2013.01); *H01L 29/402* (2013.01); *H01L 29/7806* (2013.01); *H01L 29/7823* (2013.01); *H01L 29/407* (2013.01); *H01L 29/7813* (2013.01); *H01L 29/0847* (2013.01); *H01L 29/0619* (2013.01); *H01L 29/47* (2013.01); *H01L 29/0696* (2013.01); *H01L 29/0878* (2013.01)
USPC ........... 257/330; 257/331; 257/332; 257/341; 257/E21.655; 257/E29.201

(56) References Cited

U.S. PATENT DOCUMENTS

| | | | |
|---|---|---|---|
| 5,384,270 | A | 1/1995 | Ueno |
| 5,814,858 | A | 9/1998 | Williams |
| 6,040,610 | A | 3/2000 | Noguchi et al. |
| 6,049,108 | A | 4/2000 | Williams et al. |
| 6,078,090 | A | 6/2000 | Williams et al. |
| 6,239,463 | B1 | 5/2001 | Williams et al. |
| 6,320,223 | B1 | 11/2001 | Hueting et al. |
| 6,351,018 | B1 | 2/2002 | Sapp |
| 6,359,308 | B1 | 3/2002 | Hijzen et al. |
| 6,638,850 | B1 | 10/2003 | Inagawa et al. |
| 6,781,194 | B2 | 8/2004 | Baliga |
| 6,791,143 | B2 | 9/2004 | Baliga |
| 6,825,105 | B2 | 11/2004 | Grover et al. |
| 6,864,535 | B2 | 3/2005 | Tihanyi |
| 8,008,714 | B2 * | 8/2011 | Shirai et al. .................. 257/330 |

FOREIGN PATENT DOCUMENTS

| | | |
|---|---|---|
| JP | H05-75098 | 3/1993 |
| JP | 7-249770 | 9/1995 |
| JP | 10-150140 | 6/1998 |
| JP | 11-087698 | 3/1999 |
| JP | 11-154748 | 6/1999 |
| JP | 2003-017701 A | 1/2003 |
| JP | 2004-522319 T | 7/2004 |
| WO | WO 00/51167 | 8/2000 |

OTHER PUBLICATIONS

Office Action issued Aug. 8, 2013, in Japanese Patent Application No. 2011-241818.

Office Action issued Nov. 28, 2013, in Japanese Patent Application No. 2011-241818.

\* cited by examiner

SEMICONDUCTOR DEVICE INCLUDING A MOSFET AND SCHOTTKY JUNCTION

BACKGROUND OF THE INVENTION

The present invention relates to a semiconductor device and particularly to a technique which is effectively applicable to a semiconductor device having a power transistor and a Schottky barrier diode (SBD) on one and the same semiconductor substrate.

As a semiconductor device used as a switching device in a power amplifier or a power supply circuit there is known, for example, a power transistor called power MISFET (Metal Insulator Semiconductor Field Effect Transistor). The power MISFET has a structure wherein plural transistor cells comprising fine patterns of MISFETs are connected in parallel to obtain a large power. Power MISFETs called vertical type and horizontal type are known. As to the vertical type, one called a trench gate structure is also known.

MISFET indicates an insulated gate type field effect transistor wherein a gate insulating film (insulating film) is interposed between a channel forming region (semiconductor) and a gate electrode. One wherein the gate insulating film is formed by a silicon oxide film is generally called MOSFET (Metal Oxide Semiconductor Field Effect Transistor). Moreover, one wherein an electric current flows in the thickness (depth) direction of a semiconductor substrate is called a vertical type, while one wherein an electric current flows in the surface direction of a semiconductor substrate is called a horizontal type. Further, one having a channel (conductive passage) of electrons in a channel forming region between source and drain regions (i.e., under a gate electrode) is called n type (or n-channel conductor type), and one having a channel of holes is called p type (or p-channel conductive type). The trench gate structure indicates a gate structure wherein in the interior of a trench formed in one main surface of a semiconductor substrate there is formed a gate electrode through a gate insulating film. As to the power MISFET of the trench gate structure, it is described in Japanese Published Unexamined Patent Application No. Hei 7(1995)-249770 for example.

FIG. 19 is a circuit diagram of a conventional synchronous rectification type DC/DC converter using power MISFETs and FIG. 20 is a timing chart of a power MISFET for main switch and a power MISFET for synchronous rectification both shown in FIG. 19. In FIG. 19, Q1 denotes a power MISFET for main switch, Q2 denotes a power MISFET for synchronous rectification, BD1 and BD2 denote body diodes, and SBD denotes a Schottky barrier diode. The body diodes BD1 and BD2 are incorporated in the power MISFETs respectively and are connected in parallel with the power MISFETs. The Schottky barrier diode SBD is connected in parallel with the power MISFET Q2 for synchronous rectification.

In the synchronous rectification type DC/DC converter shown in FIG. 19, a period called "Dead time" is set as shown in FIG. 20 so as to prevent a lead-through current caused by simultaneous turning ON of both Q1 and Q2. In this period there flow an electric current like B in FIG. 19. In this case, a circuit loss can be decreased by connecting a Schottky barrier diode smaller in forward voltage (VF) than the body diode BD2 in parallel with the power MISFET Q2 for synchronous rectification.

The use of the Schottky barrier diode is essential in such a circuit. In this connection, a semiconductor device is disclosed, for example, in Japanese Published Unexamined Patent Application No. Hei 10(1998)-150140 wherein a semiconductor chip with a power MISFET mounted thereon and a semiconductor chip with a Schottky barrier diode mounted thereon are sealed with a single seal member. Further, a semiconductor device with both a power MISFET of the trench gate structure and a Schottky barrier diode mounted on a single semiconductor substrate is disclosed, for example, in Japanese Published Unexamined Patent Application No. Hei 11(1999)-154748.

SUMMARY OF THE INVENTION

In the semiconductor device wherein a semiconductor chip with a power MISFET mounted thereon and a semiconductor chip with a Schottky barrier diode mounted thereon are sealed with a single seal member, an electric connection between the power MISFET and the Schottky barrier diode is made using a bonding wire, so a parasitic inductance increases and the circuit efficiency of a DC/DC converter, etc. is deteriorated.

On the other hand, in the semiconductor device with both a power MISFET of the trench gate structure and a Schottky barrier diode mounted on a single semiconductor substrate, the bonding wire for electric connection between the power MISFET and the Schottky barrier diode can be omitted, so it is possible to decrease a parasitic inductance. As a result, it is possible to control the current flowing time in the body diode of the power MISFET and hence possible to greatly decrease the loss of "Dead time" period during operation of the DC/DC converter which is controlled by PWM.

However, having studied the semiconductor device with both a power MISFET of the trench gate structure and a Schottky barrier diode mounted on one and the same semiconductor substrate, the inventor in the present case found out the following problems.

According to the structure of a conventional semiconductor device, plural cells are defined by trenches in one main surface of a semiconductor substrate, and out of the plural cells, transistor cells for the formation of MISFETSs of the trench structure and Schottky cells for the formation of Schottky barrier diodes are arranged in an alternate manner. The width of each Schottky cell and that of each transistor cell are of the same size. If transistor cells and Schottky cells are arranged in an alternate manner, it is necessary that the trench positioned between adjacent transistor cell and Schottky cell be present in a number corresponding to the number of Schottky cells, thus resulting in an increase in a plane size of the semiconductor substrate, i.e., an increase in chip size.

In the transistor device having both power MISFET of the trench gate structure and Schottky barrier diode on one and the same semiconductor substrate, the area of the power MISFET and that of the Schottky barrier diode are determined so as to satisfy characteristics of the power MISFET and VF characteristics of the Schottky barrier diode, which are required by a user. Therefore, it is necessary that the ratio between the area of the power MISFET and that of the Schottky barrier diode be varied freely so as to meet the user's needs, i.e., it is necessary to ensure the freedom of design.

When the power MISFET is OFF, in the bottom portion of the trench formed between a transistor cell and the associated Schottky cell, and on the transistor cell side, there spreads a depletion layer based on pn junction between a drain region and a channel forming region, so that voltage is not directly applied to the gate insulating film. In contrast therewith, in the trench portion adjacent to the Schottky cell, there is not formed a depletion layer based on pn junction, so that voltage is applied directly to the gate insulating film, with consequent lowering in gate breakdown voltage of the power MISFET.

The Schottky barrier diode is formed by bonding a metal electrode to a semiconductor. But because of electric field concentration at an end of the metal bonded portion, there occurs a lowering in breakdown voltage of the Schottky barrier diode.

It is an object of the present invention to provide a technique capable of attaining the reduction in size of a semiconductor device which has a power transistor and a Schottky barrier diode on one and the same semiconductor substrate.

It is another object of the present invention to provide a technique capable of ensuring the freedom of design in a semiconductor device which has a power transistor and a Schottky barrier diode on one and the same semiconductor substrate.

It is a further object of the present invention to provide a technique capable of enhancing the breakdown voltage of a Schottky barrier diode in a semiconductor device which has a power transistor and the Schottky barrier diode on one and the same semiconductor substrate.

It is a still further object of the present invention to provide a technique capable of enhancing the breakdown voltage between source and drain of a power transistor in a semiconductor device which has the power transistor and a Schottky barrier diode on one and the same semiconductor device.

The above and other objects and novel features of the present invention will become apparent from the following description and the accompanying drawings.

Typical inventions disclosed herein will be outlined below.

(1) A semiconductor device according to the present invention comprises:

a first region and a second region formed on a main surface of a semiconductor substrate;

a plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a third semiconductor region formed between adjacent said second conductors in the second region, the third semiconductor region having the same conductivity type as that of the second semiconductor region and being lower in density than the second semiconductor region; and a metal formed on the semiconductor substrate in the second region, the third semiconductor region having a metal contact region for contact with the metal, the metal being electrically connected to the second semiconductor region, and a center-to-center distance between adjacent said first conductors in the first region being smaller than that between adjacent said second conductors in the second region.

(2) In the semiconductor device described in the above means (1), the first and second conductors are formed through an insulating film within trenches formed in the semiconductor substrate;

the third semiconductor region is formed also under the first semiconductor region in the first region; and a MISFET is formed in the first region, the MISFET comprising the first conductors, the second semiconductor region, and the third semiconductor region as gate, source, and drain, respectively.

(3) In the semiconductor device described in the above means (2), a center-to-center distance between adjacent said second conductors in the second region is larger than the depth of each of the trenches in a plane perpendicular to the semiconductor substrate.

(4) In the semiconductor device described in the above means (2), a fourth semiconductor region is included in the third semiconductor region in the second region, the fourth semiconductor region being formed so as to surround an end portion of the metal contact region and the second conductors and having a conductivity type opposite to that of the third semiconductor region.

(5) In the semiconductor device described in the above means (4), the fourth semiconductor region is a guard ring. (6) In the semiconductor device described in the above means (4), a center-to-center distance between adjacent said second conductors in the second region is not smaller than twice the center-to-center distance between adjacent said first conductors in the first region.

(7) In the semiconductor device described in the above means (1), the metal in the second region and the third semiconductor region form a Schottky junction.

(8) In the semiconductor device described in the above means (1), the first region and the second region are adjacent to each other and are each formed in a plural number.

(9) In the semiconductor device described in the above means (1), the first region and the second region are adjacent to each other, and the first region is formed in a plural number, while the second region is formed in a singular number.

(10) A semiconductor device according to the present invention comprises:

a first region and a second region formed on a main surface of a semiconductor substrate;

a plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a third semiconductor region formed between adjacent said second conductors in the second region, the third semiconductor region having the same conductivity type as that of the second semiconductor region and being lower in density than the second semiconductor region; and a metal formed on the semiconductor substrate in the second region, the third semiconductor region having a metal contact region for contact with the metal, the metal being electrically connected to the second semiconductor region, and a fourth semiconductor region being included in the third semiconductor region in the second region, the fourth semiconductor region being formed so as to surround an end portion of the metal contact region and the second conductors and having a conductivity type opposite to that of the third semiconductor region.

(11) In the semiconductor device described in the above means (10), the third semiconductor region is formed also under the semiconductor region in the first region;

a first insulating film and a second insulating film are formed respectively between the first conductor and the semiconductor substrate and between the second conductor and the semiconductor substrate; and a MISFET is formed in the first region, the MISFET comprising the first conductors, the second semiconductor region, and the third semiconductor region as gate, source, and drain, respectively.

(12) In the semiconductor device described in the above means (11), the first and second conductors are formed through the first and second insulating films within trenches formed in the semiconductor substrate.

(13) In the semiconductor device described in the above means (11), the metal in the second region and the third semiconductor region form a Schottky junction.

(14) In the semiconductor device described in the above means (11), the depth of the fourth semiconductor region in a plane perpendicular to the semiconductor substrate is larger than the depth of the first semiconductor region.

(15) In the semiconductor device described in the above means (11), a third insulating film thicker than the first and second insulating films is formed in a region formed on the main surface of the semiconductor substrate in the second region and including an end face of the metal contact region.

(16) A semiconductor device according to the present invention comprises:

a first region and a second region formed on a main surface of a semiconductor substrate;

plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a third semiconductor region formed between adjacent said second conductors in the second region, the third semiconductor region having the same conductivity type as that of the second semiconductor region and being lower in density than the second semiconductor region;

a fourth semiconductor region having the same conductivity type as that of the third semiconductor region and higher in density than the third semiconductor region, formed under the third semiconductor region; and a metal formed on the semiconductor substrate in the second region, the metal being electrically connected to the second semiconductor region, and the third semiconductor region being in contact with the metal to form a Schottky junction.

(17) A semiconductor device according to the present invention comprises:

a first region and a second region formed on a main surface of a semiconductor substrate;

a plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a first semiconductor region formed between adjacent said second conductors in the second region, the third semiconductor region having the same conductivity type as that of the second semiconductor region and being lower in density than the second semiconductor region; and a metal formed on the semiconductor substrate in the second region, the metal being electrically connected to the second semiconductor region, the third semiconductor region being in contact with the metal to form a Schottky junction, and the first and second regions being adjacent to each other, and the second region being formed so as to surround the first region in a plane parallel to the semiconductor substrate.

(18) A semiconductor device according to the present invention comprises:

a first region and a second region formed on a main surface of a semiconductor substrate;

a plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a third semiconductor region formed between adjacent said second conductors in the second region, the third semiconductor region having the same conductivity type as that of the second semiconductor region and being lower in density than the second semiconductor region;

a first metal and a second metal formed on the semiconductor substrate in the first and second regions respectively, the first metal being electrically connected to the second semiconductor region;

the second metal being in contact with the third semiconductor region to form a Schottky junction, the first metal and the second metal being connected together electrically, and a work function of the second metal being larger than that of the first metal.

(19) A semiconductor device according to the present invention comprises:

a first region and a second region formed on a main surface of a semiconductor substrate;

a plurality of first conductors and a plurality of second conductors formed in the first and second regions respectively;

a first semiconductor region and a second semiconductor region formed between adjacent said first conductors in the first region, the second semiconductor region lying in the first semiconductor region and having a conductivity type opposite to that of the first semiconductor region;

a third semiconductor region formed between adjacent said second conductors in the second region, the third semiconductor region having the same conductivity type as that of the second semiconductor region and being lower in density than the second semiconductor region;

a fourth semiconductor region having the same conductivity type as that of the third semiconductor region and higher in density than the third semiconductor region, formed under the first semiconductor region in the first region; and a metal formed on the semiconductor substrate in the second region, the metal being electrically connected to the second semiconductor region; and the metal being in contact with the third semiconductor region to form a Schottky junction. (20) In the semiconductor device described in the above means (19), the first and second conductors are formed through an insulating film within trenches formed in the semiconductor substrate; and in the first region is formed a MISFET comprising the first conductors, the second semiconductor region, and the fourth semiconductor region as gate, source, and drain, respectively. (21) In the semiconductor device described in the above means (19), a fourth semiconductor region is included in the third semiconductor region in the second region, the fourth semiconductor region being formed so as to surround an end portion of the Schottky junction and having a conductivity type opposite to that of the third semiconductor region.

DETAILED DESCRIPTION OF PREFERRED EMBODIMENTS

Figure 1:
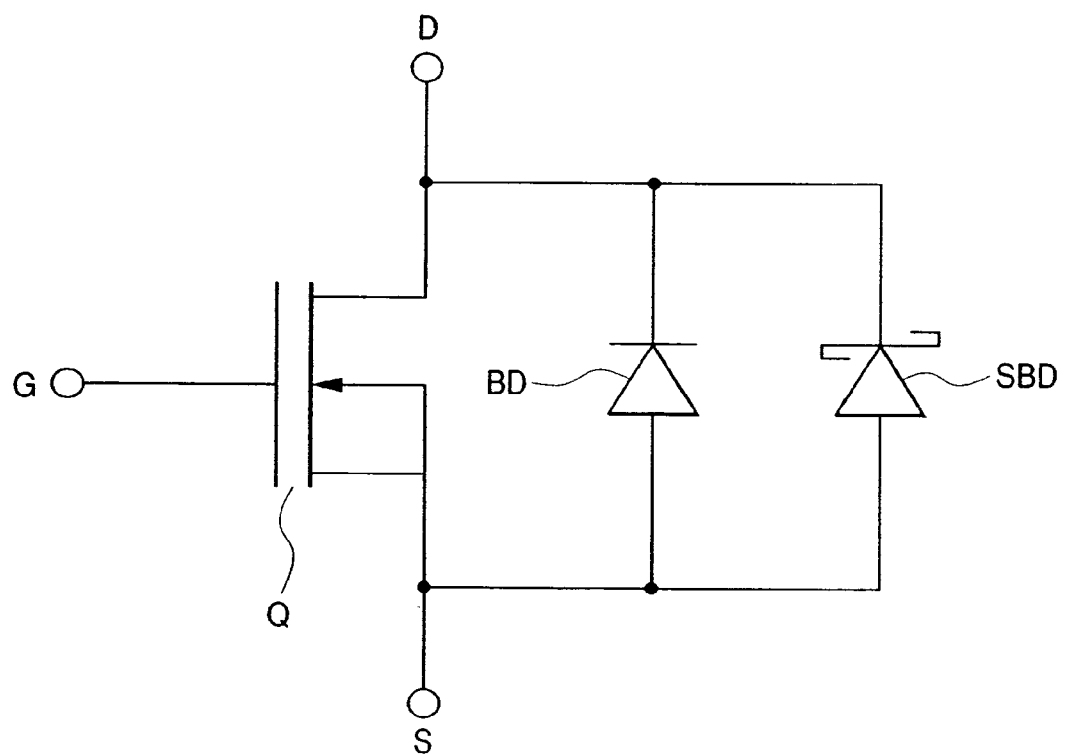
FIG. 1 is an equivalent circuit diagram of a semiconductor device according to a first embodiment of the present invention.

Embodiments of the present invention will be described in detail hereinunder with reference to the accompanying drawings. In all the drawings for explaining the embodiments of the present invention, components having the same functions are identified by like reference numerals, and repeated explanations thereof will be omitted.

(First Embodiment)

In this embodiment the present invention is applied to a semiconductor device which has a power MISFET of a trench gate structure and a Schottky barrier diode on one and the same semiconductor substrate.

Figure 2:
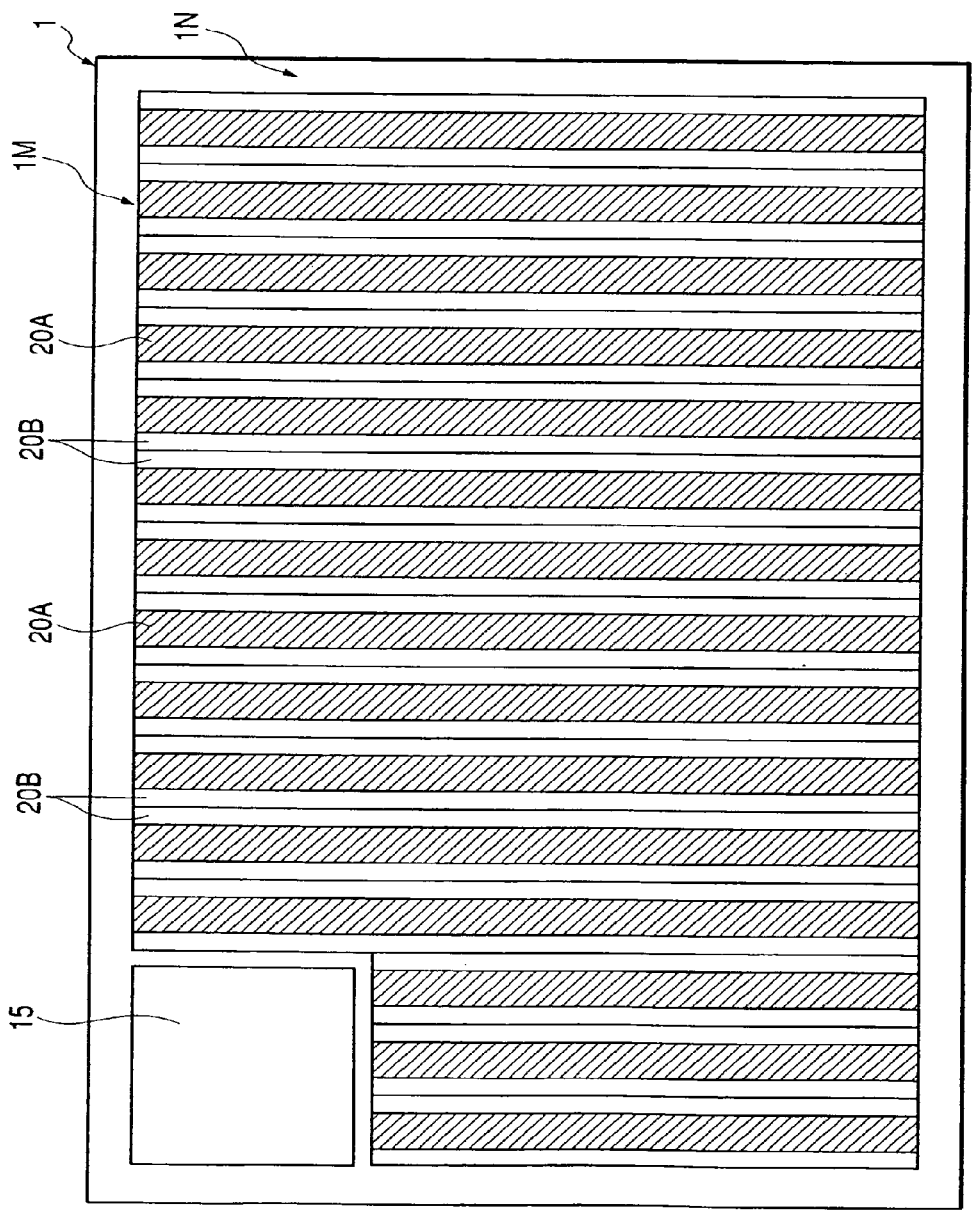
FIG. 2 is chip layout diagram showing a schematic construction of the semiconductor device illustrated in FIG. 1.
Figure 3:
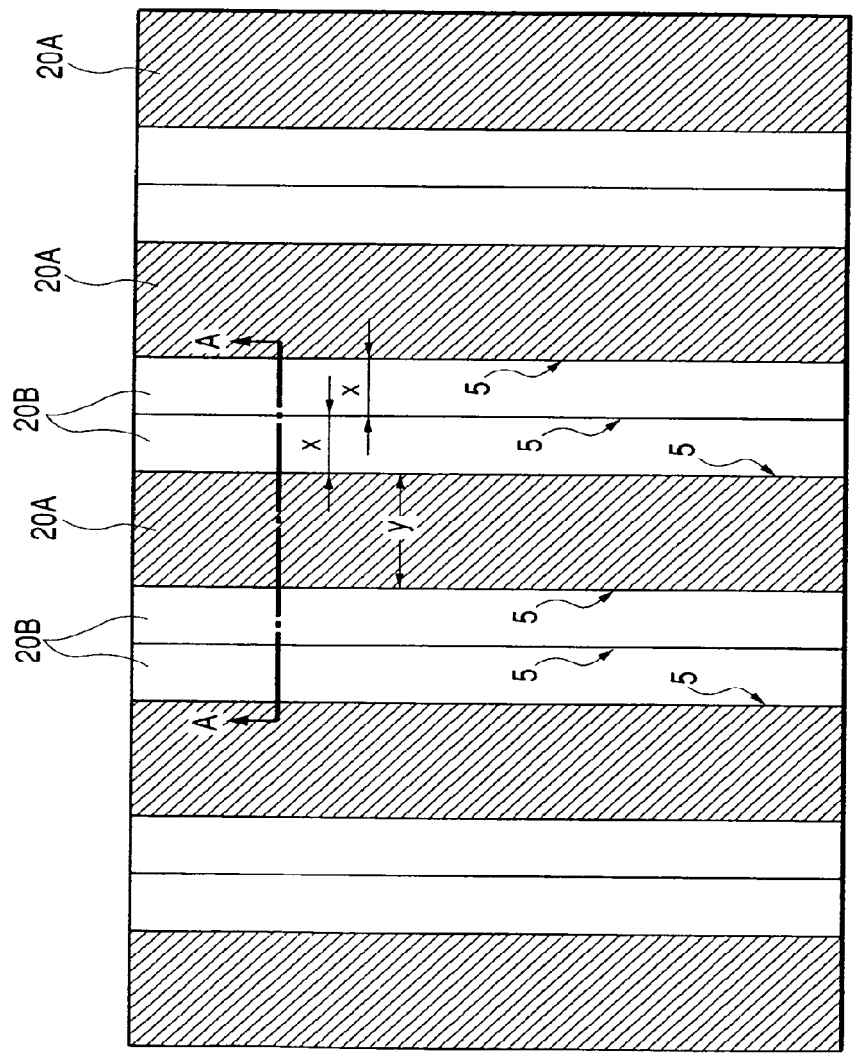
FIG. 3 is a partially enlarged, schematic plan view of FIG. 2.

FIG. 1 is an equivalent circuit diagram of the semiconductor device of the first embodiment;

FIG. 2 is a chip layout diagram showing a schematic construction of the semiconductor device illustrated in FIG. 1;

FIG. 3 is a partially enlarged, schematic plan view of FIG. 2; and

Figure 4:
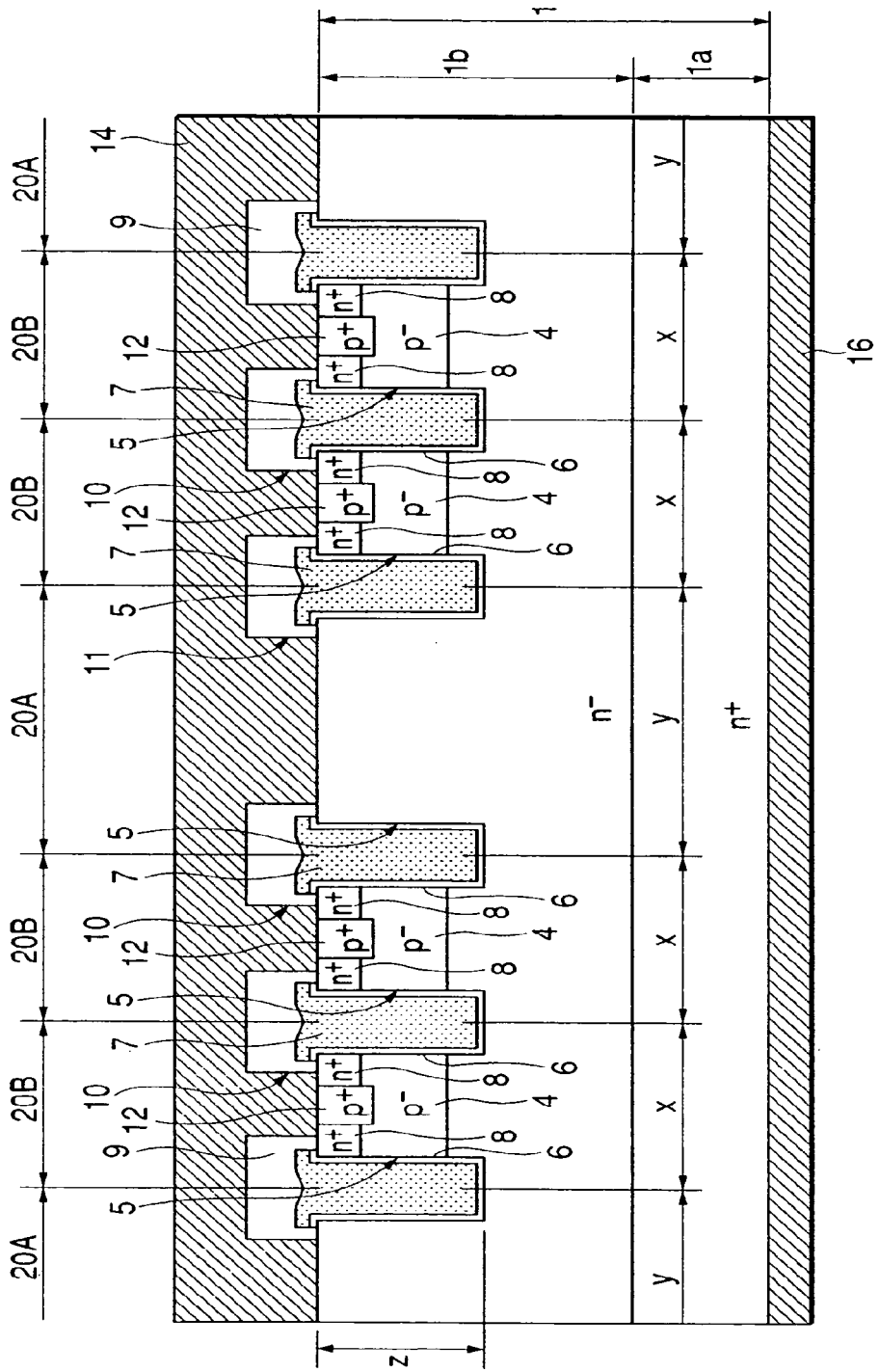
FIG. 4 is a schematic sectional view taken along line A-A in FIG. 3.

FIG. 4 is a schematic sectional view taken along line A-A in FIG. 3.

As shown in FIG. 1, the semiconductor device of this embodiment has a power MISFET Q, a body diode BD, and a Schottky barrier diode SBD. These elements (Q, BD, SBD) are mounted on one and the same semiconductor substrate. The body diode BD and the Schottky barrier diode SBD are connected in parallel with the power MISFET Q. In the body diode BD and the Schottky barrier diode SBD, respective cathode regions are connected to a drain region of the power MISFET Q, while respective anode regions are connected to a source region of the power MISFET Q. The power MISFET is of a structure wherein plural transistor cells comprising fine patterns of MISFETS are connected in parallel to obtain a large electric power.

As shown in FIGS. 2 to 4, the semiconductor device of this embodiment is constituted mainly by a semiconductor substrate 1. As the semiconductor substrate 1 there is used, for example, a semiconductor substrate comprising an $n^+$ type semiconductor layer 1a formed of a single crystal silicon and an $n^-$ type semiconductor layer 1b formed of a single crystal silicon on one main surface of the $n^+$ type semiconductor layer 1a. An electrode 16 is formed on another main surface (back side) opposed to the one main surface of the semiconductor substrate 1. The electrode 16 is used as a drain electrode and, for example, it is formed of a conductive material containing gold (Au) as a main component.

In a central portion 5M surrounded with a peripheral portion 1N of the one main surface of the semiconductor substrate 1 there is provided a cell array portion which comprises plural cells defined by trenches 5. Cells selected from among the plural cells are Schottky cells 20A with Schottky barrier diodes formed therein, and the other cells, exclusive of the Schottky cells 20A, are transistor cells 20B with MISFETs formed therein, the MISFETs using conductors as gate electrodes which are formed within the trenches 5 through gate insulating films 6. In this embodiment, the plural cells, including the Schottky cells 20A and the transistor cells 20B, are formed in a stripe shape extending in a second direction (Y direction). In the plural cells, one Schottky cell 20A and two transistor cells 20B are arranged alternately in a first direction (X direction) which is orthogonal to the second direction.

The MISFET in each transistor cell 20B, as shown in FIG. 4, mainly comprises a channel forming region, a gate insulating film 6, a gate electrode 7, a source region, and a drain region. The channel forming region is constituted by a p⁻ type semiconductor region (well region) 4 formed on a main surface of the n⁻ type semiconductor layer 1b. The gate insulating film 6 is formed along inner walls of the associated trench 5 and, for example, it is formed by a silicon oxide film. The gate electrode 7 is formed within the trench 5 through the gate insulating film 6 and, for example, it is formed by a polycrystalline silicon film with impurity introduced therein to decrease the resistance value thereof. The source region is constituted by an n⁺ type semiconductor region 8 which is formed in a surface portion of the p⁻ type semiconductor region 4 in contact with the region 4. The drain region is formed by both type semiconductor layer 1b and n⁺ type semiconductor layer 1a. According to the construction of this MISFET, the source region constituted by n⁺ type semiconductor region 8, the channel forming region constituted by p⁻ type semiconductor region, and the drain region constituted by both n⁻ and n⁺ type semiconductor layers 1b, 1a, are arranged in this order in the depth direction from one main surface of the semiconductor substrate 1. Thus, the MISFET is constituted as a vertical type wherein an electric current flows in the thickness direction of the semiconductor substrate 1. Further, it is constituted as an n-channel conduction type wherein a channel (conduction path) of electrons is formed in the channel forming region between the source region and the drain region (under the gate electrode).

A p⁺ type semiconductor region 12 is formed in a main surface of the p⁻ type semiconductor region 4. In the p⁺ type semiconductor region 12, its thickness extending in the depth direction from one main surface of the semiconductor substrate 1 is larger than the thickness of the n⁺ type semiconductor region 8, and the p⁺ type semiconductor region 12 is in contact with the p⁻ type semiconductor region 4.

On one main surface of the semiconductor substrate 1 are formed interlayer insulating films 9 so as to cover the gate electrodes 7 from above, the interlayer insulating films 9 being each formed by a silicon oxide film for example. Electrodes 14 and 15 (see FIG. 2) are formed of, for example, aluminum (Al) or an aluminum alloy so as to overlie the interlayer insulating films 9. The electrode 14 is electrically connected to the n⁺ type semiconductor regions 8 and the p⁺ type semiconductor regions 12 in the transistor cells 20B through connecting holes 10 formed in the interlayer insulating films 9, and is further connected electrically to the n⁻ type semiconductor layer 1b in the interiors of Schottky cells 20A through connecting holes 10 formed in the interlayer insulating film 9. The electrode 15 is electrically connected to gate lead-out wiring lines which are integral with the gate electrodes 7.

The Schottky barrier diode in each Schottky cell 20A is formed by a Schottky junction of n⁻ type semiconductor layer 1b and electrode 14, with n⁻ type semiconductor layer 1b and electrode 14 being used as cathode region and anode region, respectively. Thus, the electrode 14 is used as both source electrode and anode electrode.

The width (distance from the center of one of two trenches 5 confronting each other to the center of the other) y of each Schottky cell 20A is set larger than the width (distance from the center of one of two trenches 5 confronting each other to the center of the other) x of each transistor cell 20B. Further, a plane area of each Schottky cell 20A is set larger than that of each transistor cell 20B.

If the proportion occupied by the Schottky barrier diode SBD and that occupied by the power MISFET Q for one semiconductor substrate are made constant, the number of the trenches 5 can be decreased by making the width y of each Schottky cell 20A larger than the width x of each transistor cell 20B (width x of 20B<width y of 20A) and by thereby decreasing the number of Schottky cells 20A, so that the plane size of the semiconductor substrate 1 can be reduced. On the other hand, also in case of setting the width x of each transistor cell 20B larger than the width y of each Schottky cell 20A (width x of 20B>width y of 20A) to decrease the number of transistor cells 20B, it is possible to reduce the plane size of the semiconductor substrate 1. However, a low ON resistance is required for the power MISFET Q, and for satisfying this requirement it is necessary to reduce the size of each transistor cell 20B and thereby enlarge the channel width per unit area. Therefore, for reducing the plane size of the semiconductor substrate 1 to attain the reduction in size of the semiconductor device, it is preferable that the number of Schottky cells 20A be decreased by enlarging the width y of each Schottky cell 20A rather than the width x of each transistor cell 20B.

In a semiconductor device having both power MISFET of a trench gate structure and Schottky barrier diode on one and the same semiconductor substrate, there are determined the area of the power MISFET Q and that of the Schottky barrier diode SBD so as to satisfy characteristics of the power MISFET Q and VF (forward voltage) characteristics of the Schottky barrier diode SBD, which are required by a user. Therefore, it is necessary that the ratio between the area of Q and that of SBD be varied freely to meet the user's needs. The following two methods are conceivable as methods for varying the ratio between the area of Q and that of SBD.

According to the first method, there is used a pattern wherein Schottky cells 20A and transistor cells 20B are arranged alternately, the width y of each Schottky cell 20A and the width x of each transistor cell 20B are set at different values, and the size of each Schottky cell 20A and that of each transistor cell 20B are changed to change the ratio between the area of the power MISFET Q and that of the Schottky barrier diode SBD. In this method, if the sizes of each Schottky cell 20A and that of each transistor cell 20B are equal to each other, the proportion of the area of Q and that of SBD become equal to each other.

According to the second method, the ratio in the number of cells between Schottky cells 20A and transistor cells 20B is varied to change the ratio between the area of the power MISFET Q and that of the Schottky barrier diode SBD.

In chip layout, the area of the power MISFET Q and that of the Schottky barrier diode SBD are determined so as to satisfy characteristics of Q and that of SBD which are required by a user. In this case, the user's required characteristics of Q and that of SBD differ depending on the circuit designed, so the freedom of design is necessary.

Figure 19:
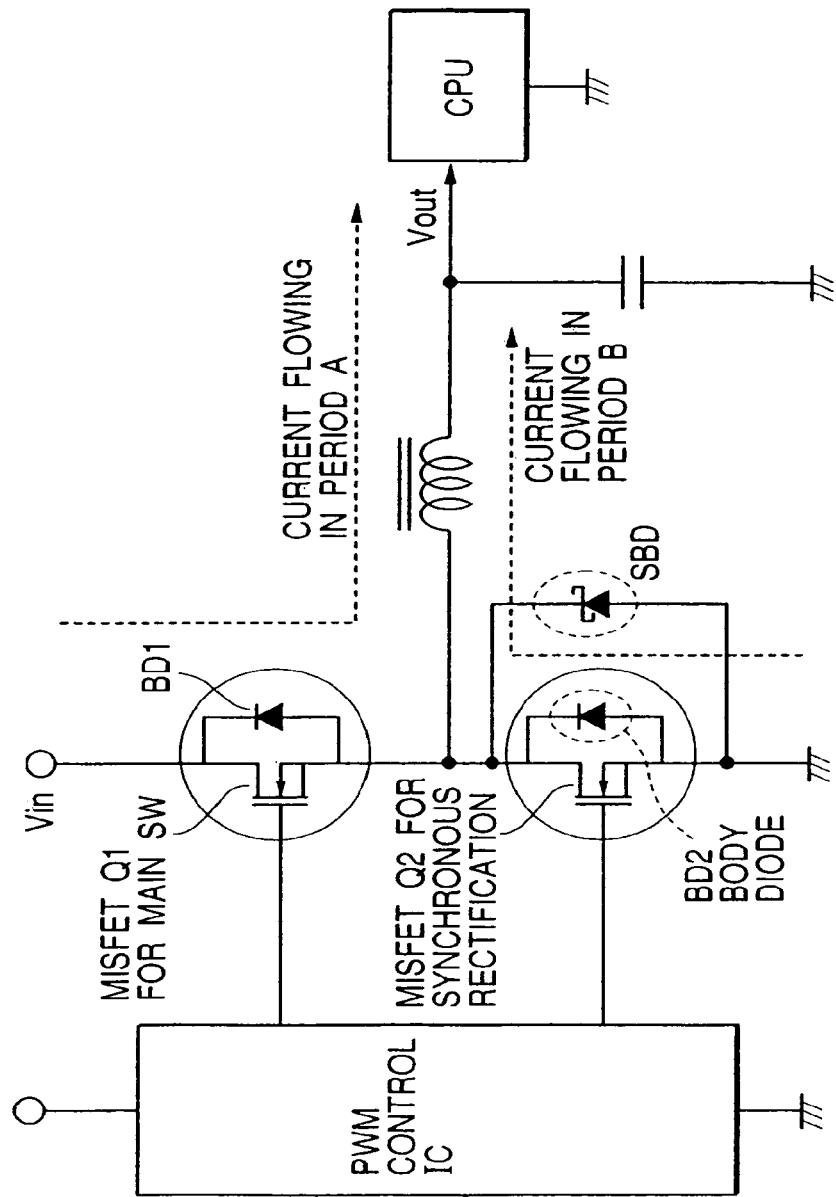
FIG. 19 is a circuit diagram of a conventional synchronous rectification type DC/DC converter.
Figure 20:
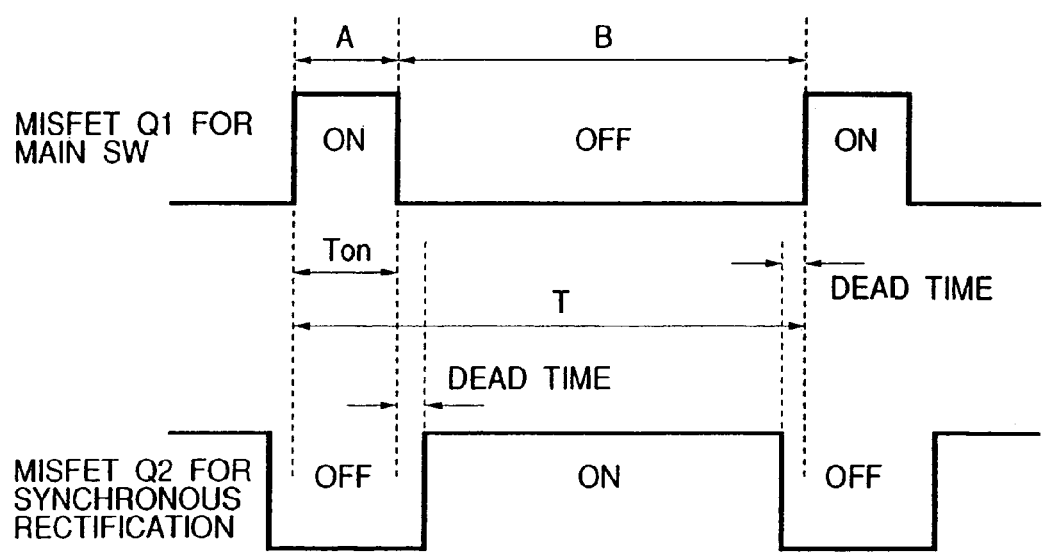
FIG. 20 is a timing chart of a power MISFET for main switch and a power MISFET for synchronous rectification both shown in FIG. 19.

The first or the second method described above is carried out. But for the above reason related to area efficiency it is preferable that the Schottky cells 20A be set large in width y and be arranged in a gathered form insofar as possible. In MISFET Q2 for synchronous rectification (see FIG. 19) which requires the Schottky barrier diode SBD, a low ON resistance is needed, so the transistor cells 20B are made as small as possible. As the cell size is reduced, the channel width (current path) per unit area increases, so it is possible to lower the ON resistance. Thus, by setting the width y of each Schottky cell 20A larger than the width x of each transistor cell 20B and by setting the size of the former larger than that of the latter, the freedom of design can be ensured (enhanced) in the semiconductor device wherein both power transistor Q and Schottky barrier diode SBD are mounted on one and the same semiconductor substrate 1.

(Second Embodiment)

Figure 5:
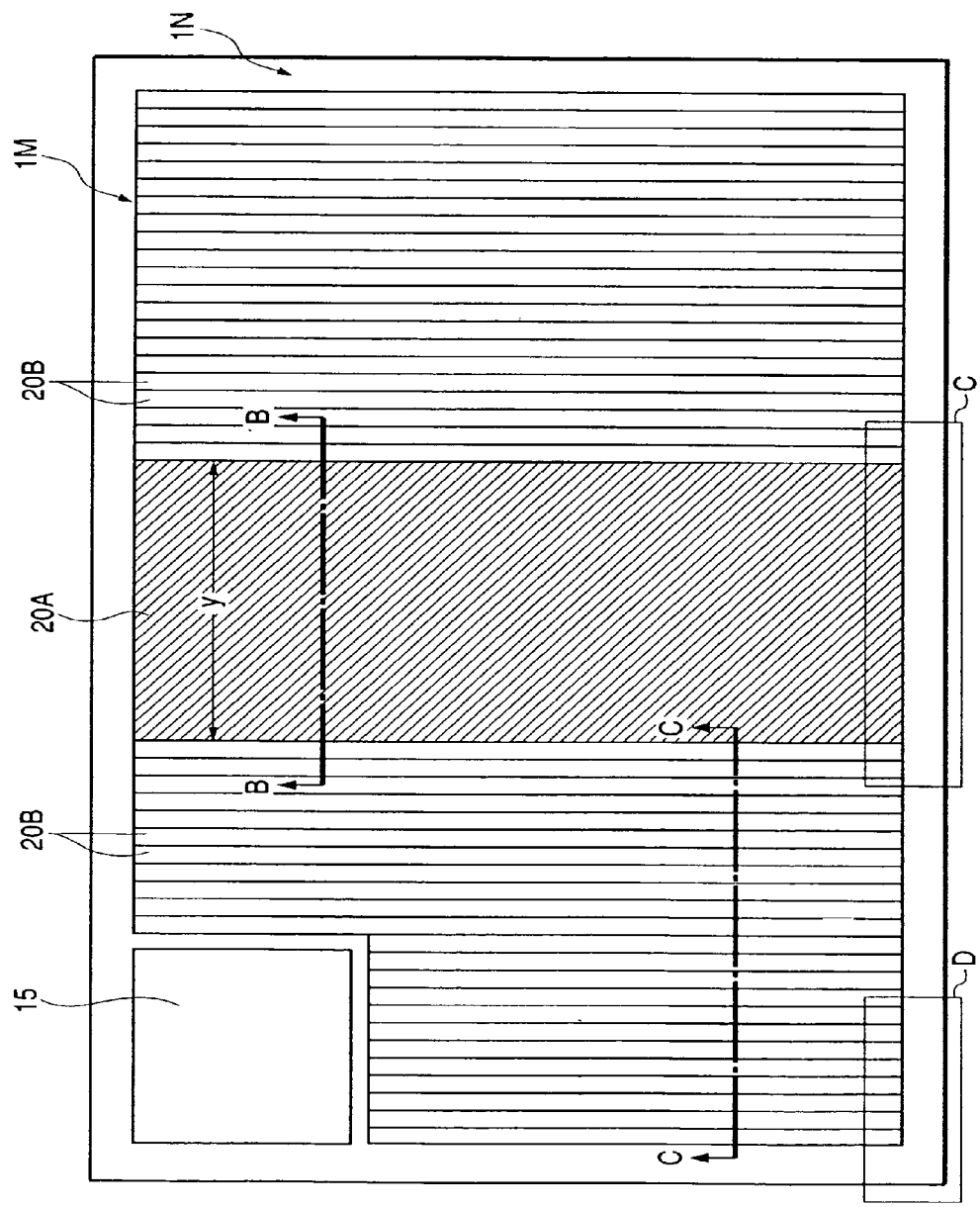
FIG. 5 is a chip layout diagram showing a schematic construction of a semiconductor device according to a second embodiment of the present invention.
Figure 6:
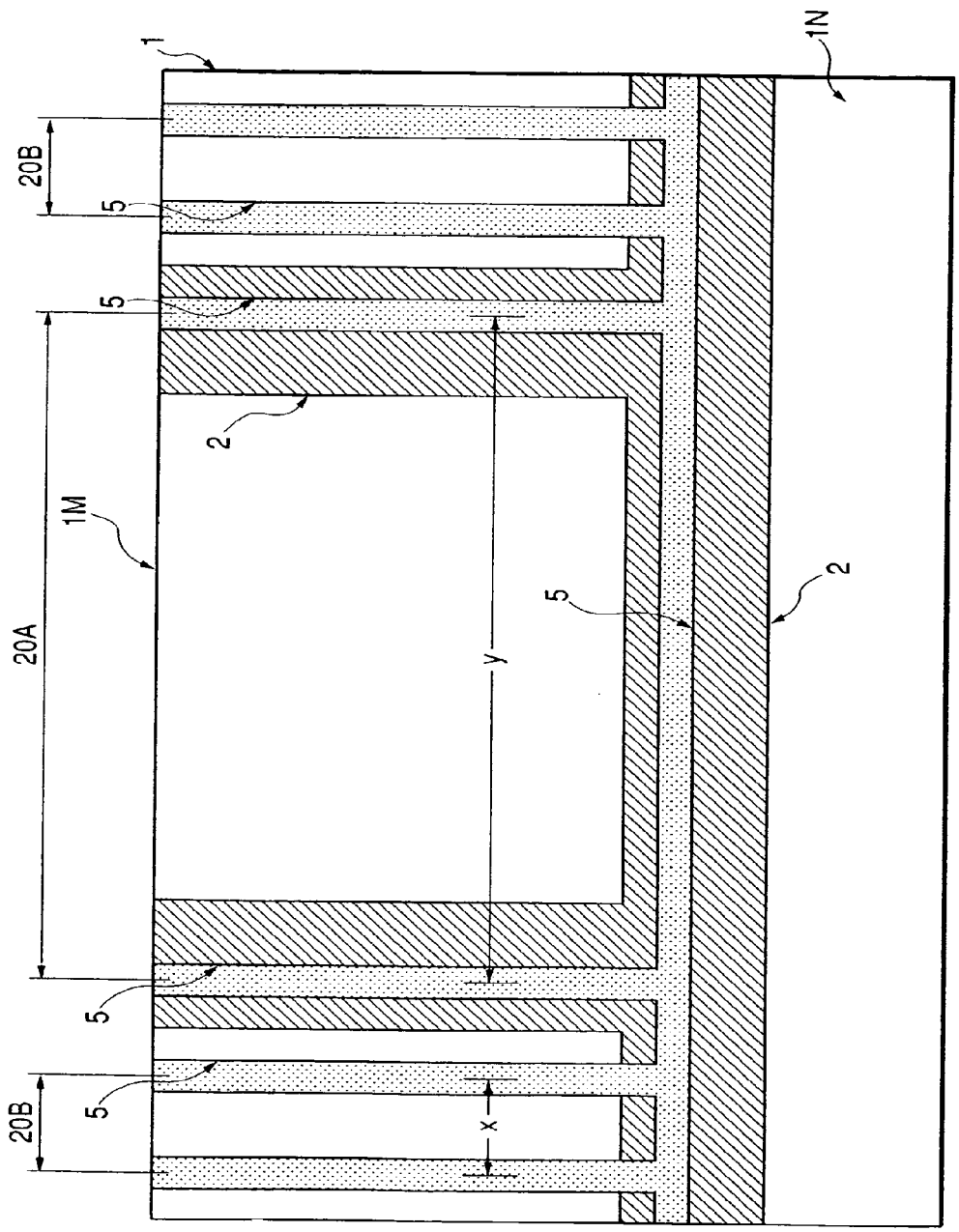
FIG. 6 is an enlarged, schematic plan view of region C which is a part of FIG. 5.
Figure 7:
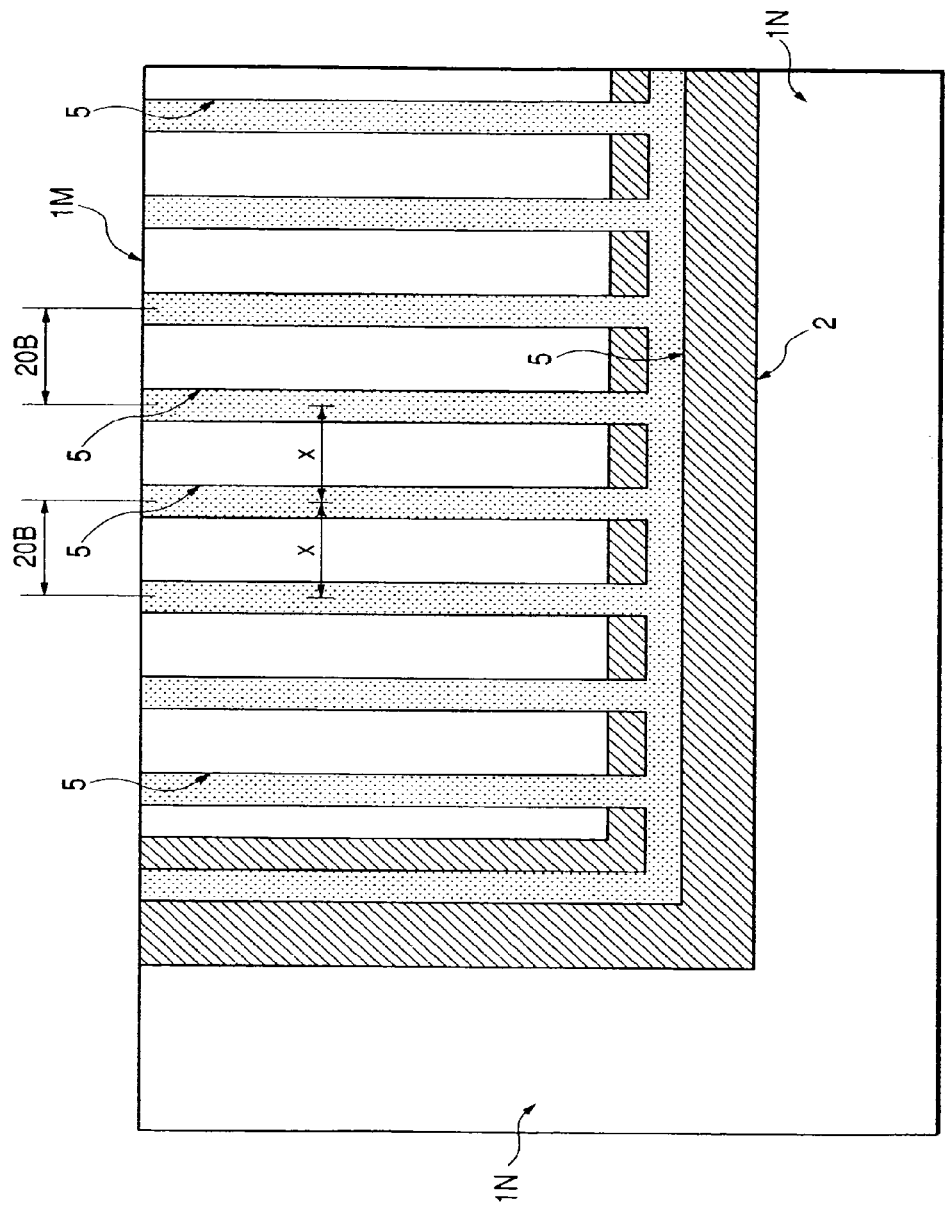
FIG. 7 is an enlarged, schematic plan view of region D which is a part of FIG. 5.
Figure 8:
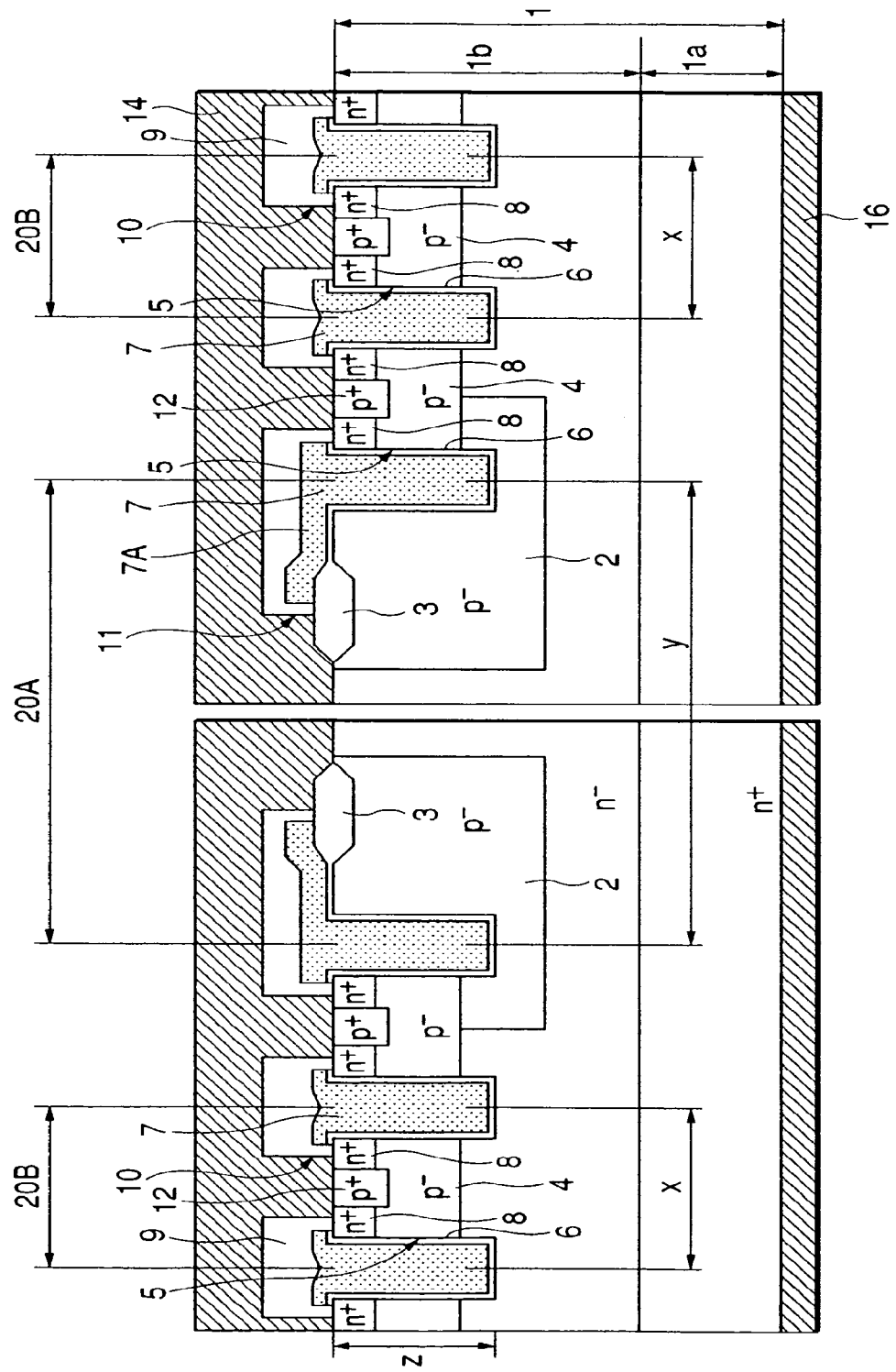
FIG. 8 is a schematic sectional view taken along line B-B in FIG. 5, with an intermediate portion omitted.
Figure 9:
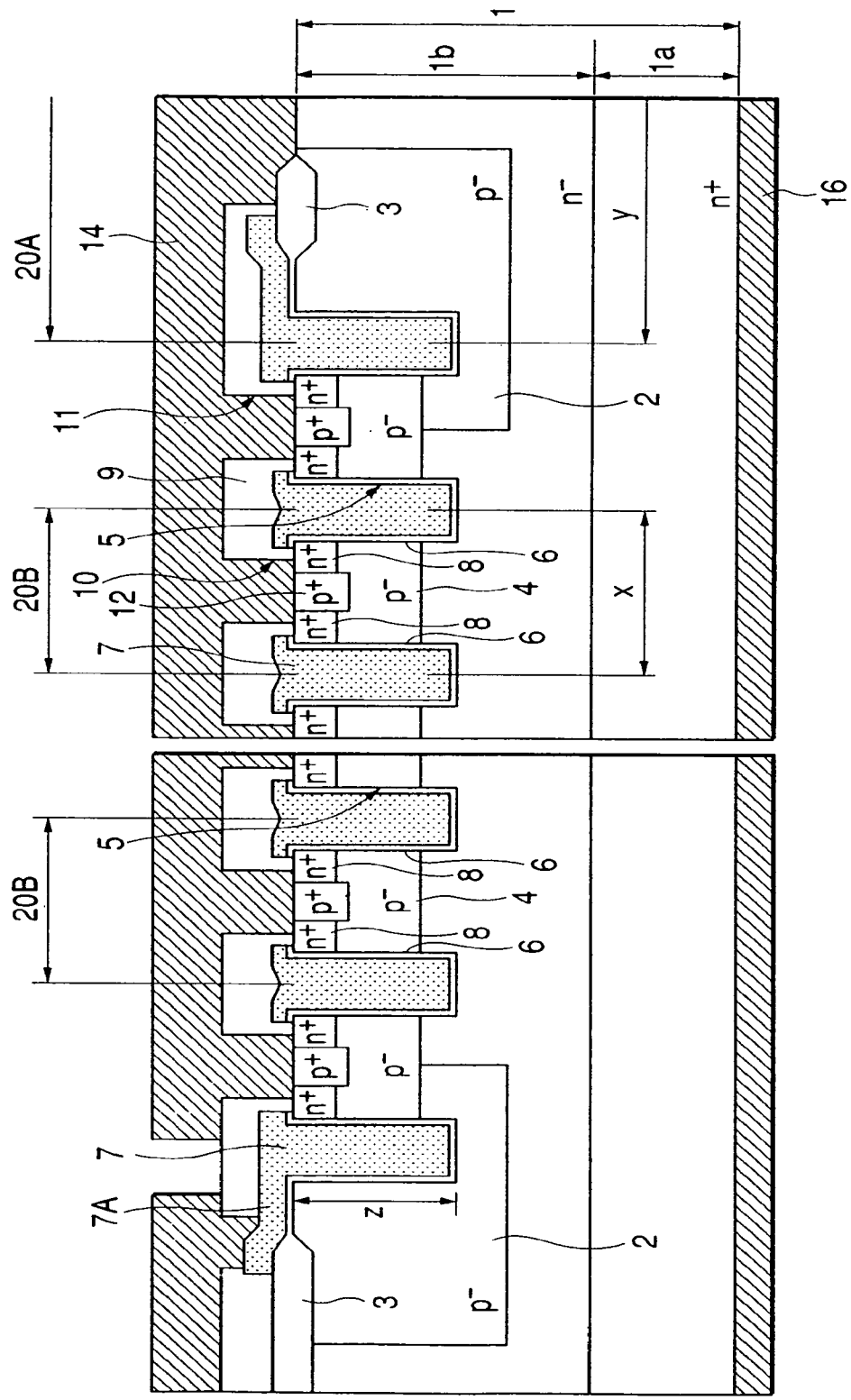
FIG. 9 is a schematic sectional view taken along line C-C in FIG. 5, with an intermediate portion omitted.
Figure 10:
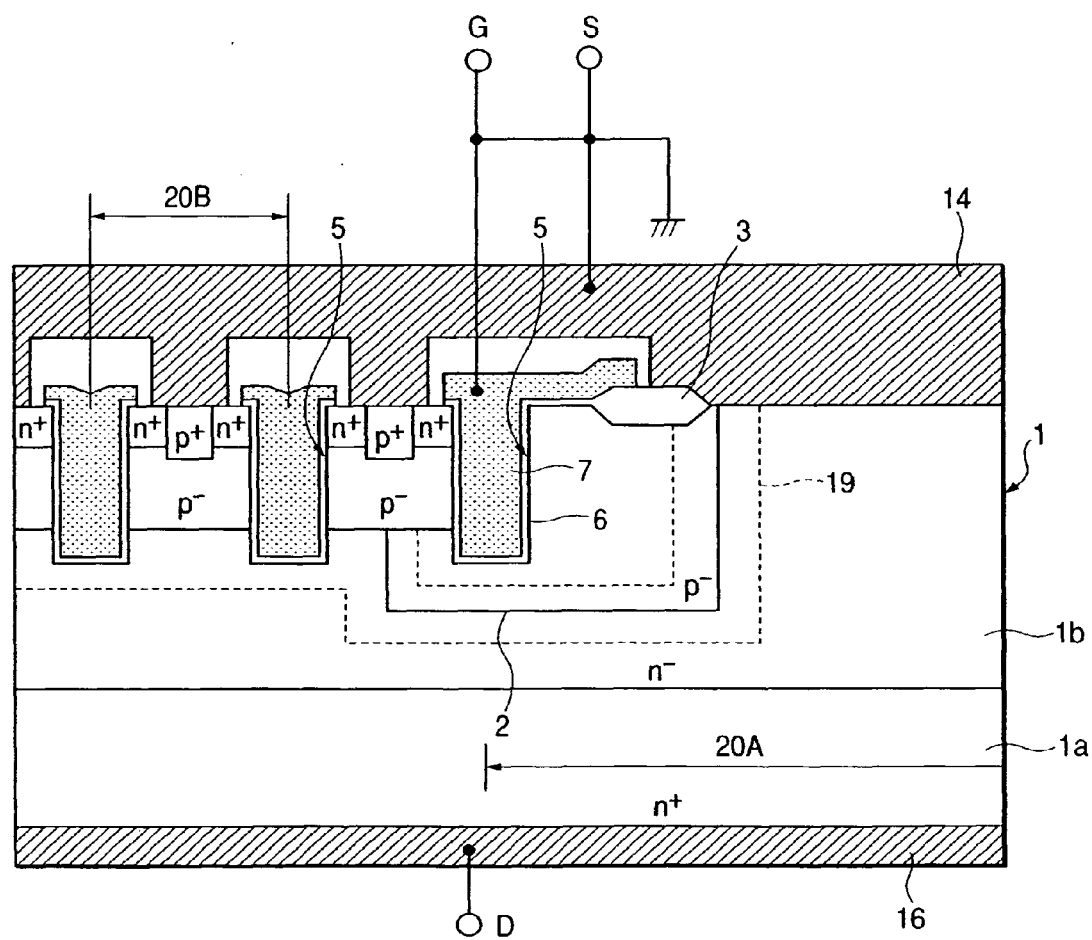
FIG. 10 is a partially enlarged, schematic sectional view of FIG. 8.

FIG. 5 is a chip layout diagram showing a schematic construction of a semiconductor device according to a second embodiment of the present invention;

FIG. 6 is an enlarged, schematic plan view of region C in FIG. 5;

FIG. 7 is an enlarged, schematic sectional view of region D in FIG. 5;

FIG. 8 is a schematic sectional view taken along line B-B in FIG. 5, with an intermediate portion omitted;

FIG. 9 is a schematic sectional view taken along line C-C in FIG. 5, with an intermediate portion omitted;

FIG. 10 is a partially enlarged, schematic sectional view of FIG. 8; and

Figure 11:
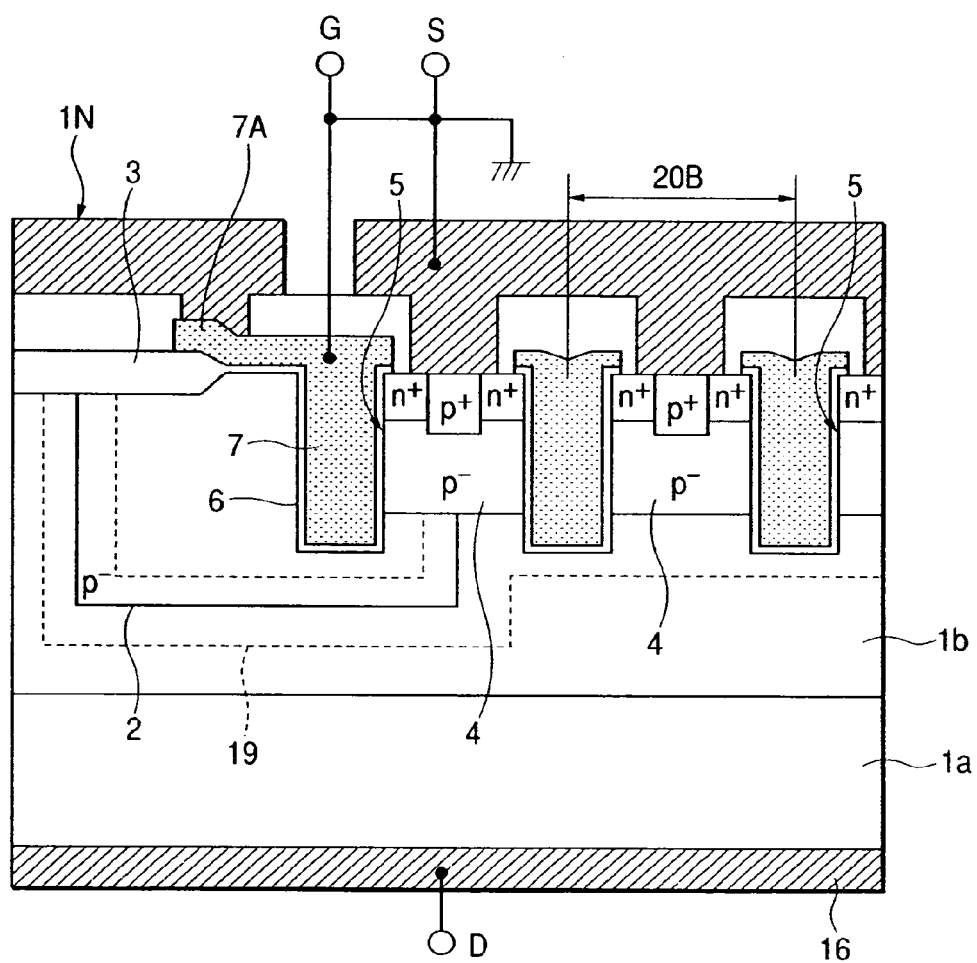
FIG. 11 is a partially enlarged, schematic sectional view of FIG. 9.

FIG. 11 is a partially enlarged, schematic sectional view of FIG. 9.

The semiconductor device of this embodiment is basically of the same construction as the previous first embodiment and is different in the following constructional points from the first embodiment.

In the previous first embodiment plural Schottky cells 20A are connected in parallel to constitute one Schottky barrier diode SBD equivalently, whereas in this second embodiment, as shown in FIG. 5, one Schottky barrier diode SBD is constituted by one Schottky cell 20A. In this second embodiment, moreover, a guard ring constituted by a p$^-$ type semiconductor region 2 is provided in the Schottky cell 20A, as shown in FIGS. 6 and 8. Further, in this embodiment, as shown in FIGS. 7 and 9, a guard ring constituted by a p$^-$ type semiconductor region (well region) 2 is provided in a peripheral portion 1N of one main surface of the semiconductor substrate 1.

As shown in FIGS. 5 to 7, plural transistor cells 20B and one Schottky cell 20A are arranged in the cell array portion of one main surface of the semiconductor substrate 1. The plural transistor cells 20B are divided into two transistor cell groups and the transistor cells 20B in each transistor cell group are arranged so as to be spread all over in the first direction (X direction).

The Schottky cell 20A is disposed and sandwiched in between the two transistor cell groups. The width y of the Schottky cell 20A is set much larger than the width x of each transistor cell 20B. Thus, by setting the width y of the Schottky cell 20A larger than the width x of each transistor cell 20B (width x of 20B<width y of 20A) and constituting a single Schottky barrier diode SBD, it is possible to greatly decrease the number of trenches 5 in comparison with the case where one Schottky barrier diode SBD is constituted equivalently by plural Schottky cells 20A as in the previous first embodiment, therefore it is possible to minimize the plane size of the semiconductor substrate 1. More particularly, in the Schottky barrier diode SBD, the width y of each Schottky cell 20A is set large to decrease the number of cells, while in the power MISFET Q, the width x of each transistor cell 20B is set small to increase the number of cells, whereby it is possible to attain a low ON resistance of the power MISFET Q and the reduction in size of the semiconductor device.

As shown in FIGS. 6 and 7, the trenches 5 positioned between Schottky cell 20A and transistor cells 20B and the trenches 5 positioned between transistor cells 20B extend in the second direction (Y direction) and are rendered integral with trenches 5 which extend along the peripheral portion 1N so as to surround the cell array portion. The p$^-$ type semiconductor region 2 is formed along the trenches 5 positioned between Schottky cells 20A and transistor cells 20B and the trenches 5 which extend so as to surround the cell array portion.

As shown in FIG. 8, the p$^-$ type semiconductor region 2 provided in the Schottky cell 20A is formed in the n$^-$ type semiconductor layer 1b and extends in the depth direction from one main surface of the semiconductor substrate 1 (one main surface of the n$^-$ type semiconductor layer 1b). In Schottky cell 20A, an end portion of the Schottky junction between the n$^-$ type semiconductor layer 1b and the electrode 14, i.e., an end portion of the barrier metal which is in contact with the Schottky cell 20A, terminates in the p$^-$ type semiconductor region 2 provided in the Schottky cell 20A.

The p$^-$ type semiconductor region 2 in the Schottky cell 20A is diffused deeper than the depth of each trench 5, and the trenches 5 positioned between the Schottky cell 20A and transistor cells 20B, i.e., the trenches 5 which define the Schottky cell 20A, are each formed in the p$^-$ type semiconductor region 2.

Gate electrodes 7 positioned between transistor cells 20B and the Schottky cell 20A are integral with gate lead-out wiring lines 7A which are drawn out to the Schottky cell 20A side. In the Schottky cell 20A, a field insulating film 3 thicker than the gate insulating film 6 is formed between each gate lead-out wiring line 7A and one main surface of the n$^-$ type semiconductor layer 1b (one main surface of the semiconductor substrate 1). The field insulating film 3 is formed selectively by a thermal oxidation method.

As shown in FIG. 9, the p$^-$ type semiconductor region 2 provided in the peripheral portion 1N is formed in the n$^-$ type semiconductor layer 1b and extends in the depth direction from one main surface of the semiconductor substrate 1. The p$^-$ type semiconductor region 2 is diffused deeper than the depth of each trench 5 and each trench 5 located between the peripheral portion 1N and a transistor cell 20B adjacent thereto is formed in the p$^-$ type semiconductor region 2.

Breakdown voltage (source-drain breakdown voltage) as a basic performance of the power MISFET Q is determined by a pn junction breakdown voltage between the n$^-$ type semiconductor layer 1b as a drain region and the p$^-$ type semiconductor region 4 as a channel forming region. The pn junction breakdown voltage is represented by a voltage until flowing of an avalanche breakdown current when a positive voltage is applied to the drain region (BVDSS state) with the gate electrode and the source region to the ground.

When the gate electrode and the source region are connected to the ground and a positive voltage is applied to the drain region into BVDSS state, a depletion layer 19 is formed along the pn junction between the p$^-$ type semiconductor region 2 and the n$^-$ type semiconductor region 1b and also along the pn junction between the p$^-$ type semiconductor region 4 and the n$^-$ type semiconductor layer 1b. An end portion of the Schottky junction of both n$^-$ type semiconductor layer 1b and the electrode 14 (an end portion of the barrier metal which is in contact with the Schottky cell 20A) terminates in the p$^-$ type semiconductor region 2 provided in the Schottky cell 20A, so the electric field concentrated on the end portion, indicated at 25, of the junction is relaxed by the depletion layer 19, whereby the breakdown voltage of the Schottky barrier diode SBD can be increased.

In the Schottky cell 20A, the thick field insulating film 3 is formed on one main surface of the semiconductor substrate 1 on the p$^-$ type semiconductor region 2. By providing the field insulating film 3 in this portion it is possible to weaken the electric field of the depletion layer 19 which extends to the p$^-$ type semiconductor region 2, so that it is possible to further raise the breakdown voltage of the Schottky barrier diode.

The p⁻ type semiconductor region 2 in the Schottky cell 20A is diffused deeper than the depth of each trench 5, and a trench 5 positioned between the Schottky cell 20A and a transistor cell 20B, i.e., a trench 5 which defines the Schottky cell 20A, is formed in the p⁻ type semiconductor region 2. According to this construction, the depletion layer expands to the bottom portion of the trench 5 positioned between the Schottky cell 20A and the transistor cell 20B, so that voltage is no longer applied directly to the gate insulating film 6. As a result, it is possible to lower the voltage applied to the gate insulating film 6 and hence possible to raise the gate breakdown voltage of the power MISFET Q.

In the MISFET portion, since each transistor cell undergoes avalanche breakdown in a uniform manner, the current density does not become high (because current does not flow locally) and breakage is difficult to occur. On the other hand, the peripheral portion 1N undergoes avalanche breakdown near the surface of the junction, so that current flows locally and breakage is apt to occur. For this reason, the p⁻ type semiconductor region 2 is made deeper than the p⁻ type semiconductor region 4 (the radius of curvature of the semiconductor region is made large) to make the breakdown voltage of the peripheral portion higher than that of the MISFET portion. Further, by making the p⁻ type semiconductor region 2 deeper than each trench 5, it is possible to further relax the voltage applied to the gate insulating film 6 and hence possible to raise the breakdown voltage of the peripheral portion.

For enclosing a pair of trenches 5 in the Schottky cell 20A, it is necessary that a lateral diffusion of the p⁻ type semiconductor region 2 as a guard ring be not less than the depth z of each trench 5.

(Third Embodiment)

Figure 12:
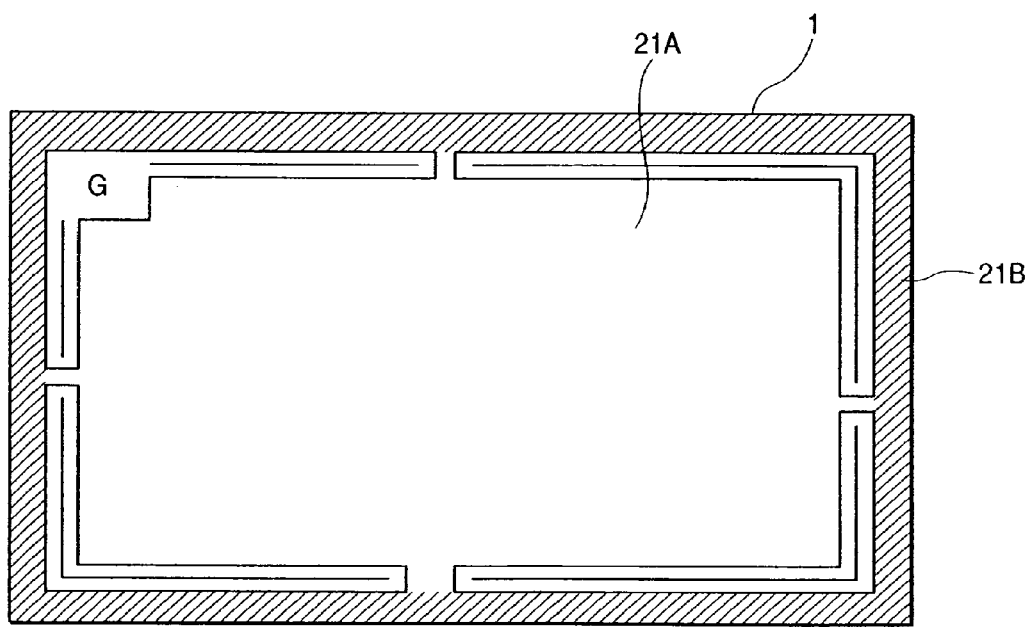
FIG. 12 is a chip layout diagram showing a schematic construction of a semiconductor device according to a third embodiment of the present invention.

FIG. 12 is a chip layout diagram showing a schematic construction of a semiconductor device according to a third embodiment of the present invention.

As shown in FIG. 12, the semiconductor device of this third embodiment is laid out so that a transistor device forming portion (active region) 2 with a transistor cell of power MISFET formed therein is surrounded by a Schottky device forming portion 21B with Schottky barrier diode SBD formed therein. Even with such a layout, the plane size (chip size) of the semiconductor substrate 1 can be made small as in the first embodiment. It is also possible to ensure the freedom in design of the semiconductor device.

Since the Schottky barrier diode is generally a surface device determined by the interface between metal and semiconductor, it is preferable that damage in package assembly (especially damage in wire bonding) be as small as possible. As in this third embodiment, by making layout so that the transistor device forming portion 21A with a transistor cell of power MISFET formed therein is surrounded by the Schottky device forming portion 21B, it is possible to effect assembly even without wire bonding to the Schottky device forming portion 21B.

(Fourth Embodiment)

Figure 13:
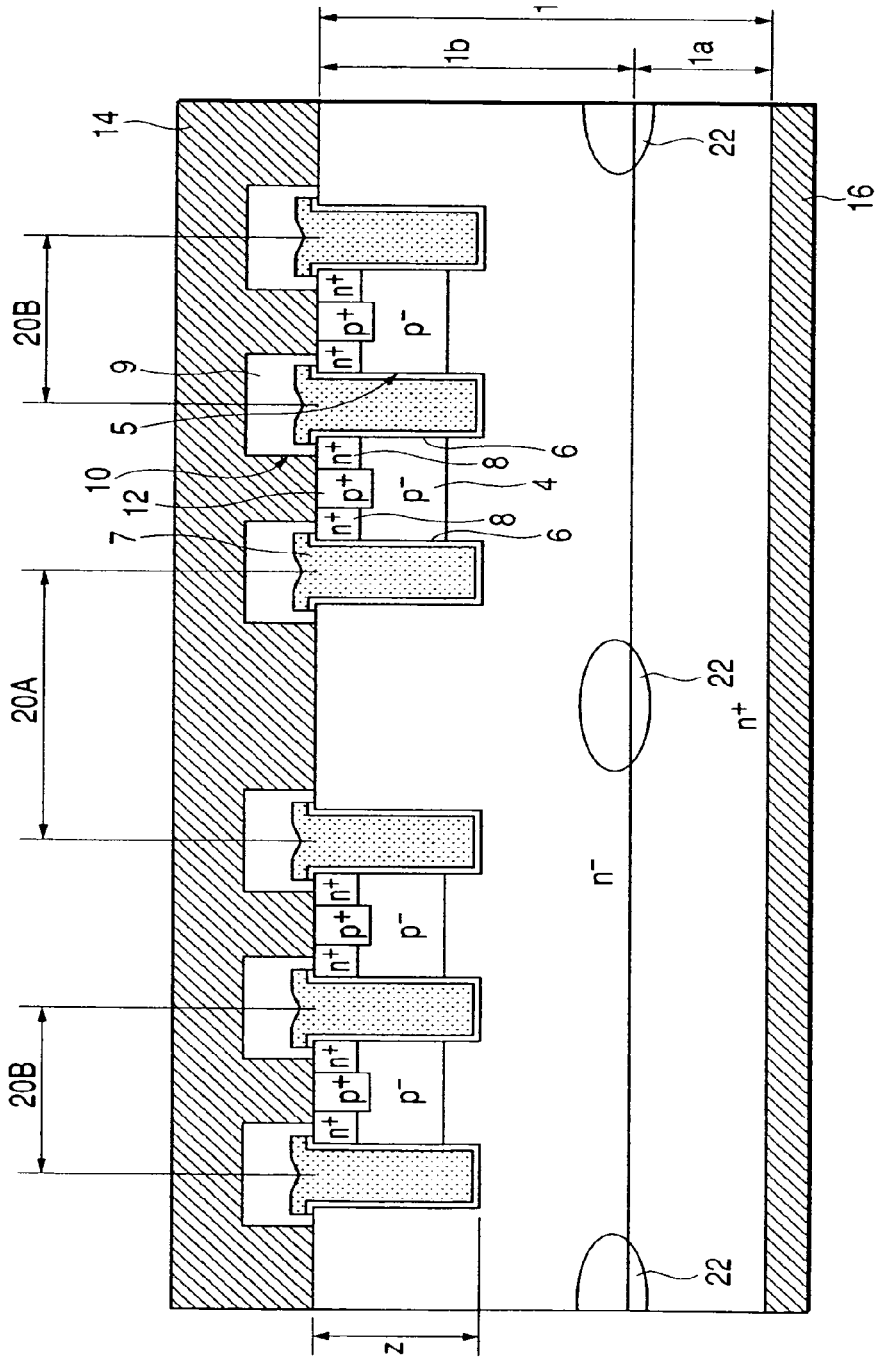
FIG. 13 is a schematic sectional view showing a schematic construction of a semiconductor device according to a fourth embodiment of the present invention.

FIG. 13 is a schematic sectional view showing a schematic construction of a semiconductor device according to a fourth embodiment of the present invention.

As shown in FIG. 13, the semiconductor device of this embodiment is basically the same in construction as the first embodiment and is different in the following constructional point.

In the Schottky cell 20A, an n⁺ type semiconductor region 22 is provided in an n⁻ type semiconductor layer 1b, the n⁺ type semiconductor region 22 having an impurity concentration higher than that of the n⁻ type semiconductor layer 1b. A n⁺ type semiconductor region 22 is formed at a position deeper than the metal-semiconductor interface in the Schottky cell 20A. That is, the impurity concentration of the Schottky cell 20A is made high in its region deeper than the metal-semiconductor interface. With such a construction, a parasitic resistance of the Schottky barrier diode can be decreased while ensuring a high breakdown voltage.

(Fifth Embodiment)

Figure 14:
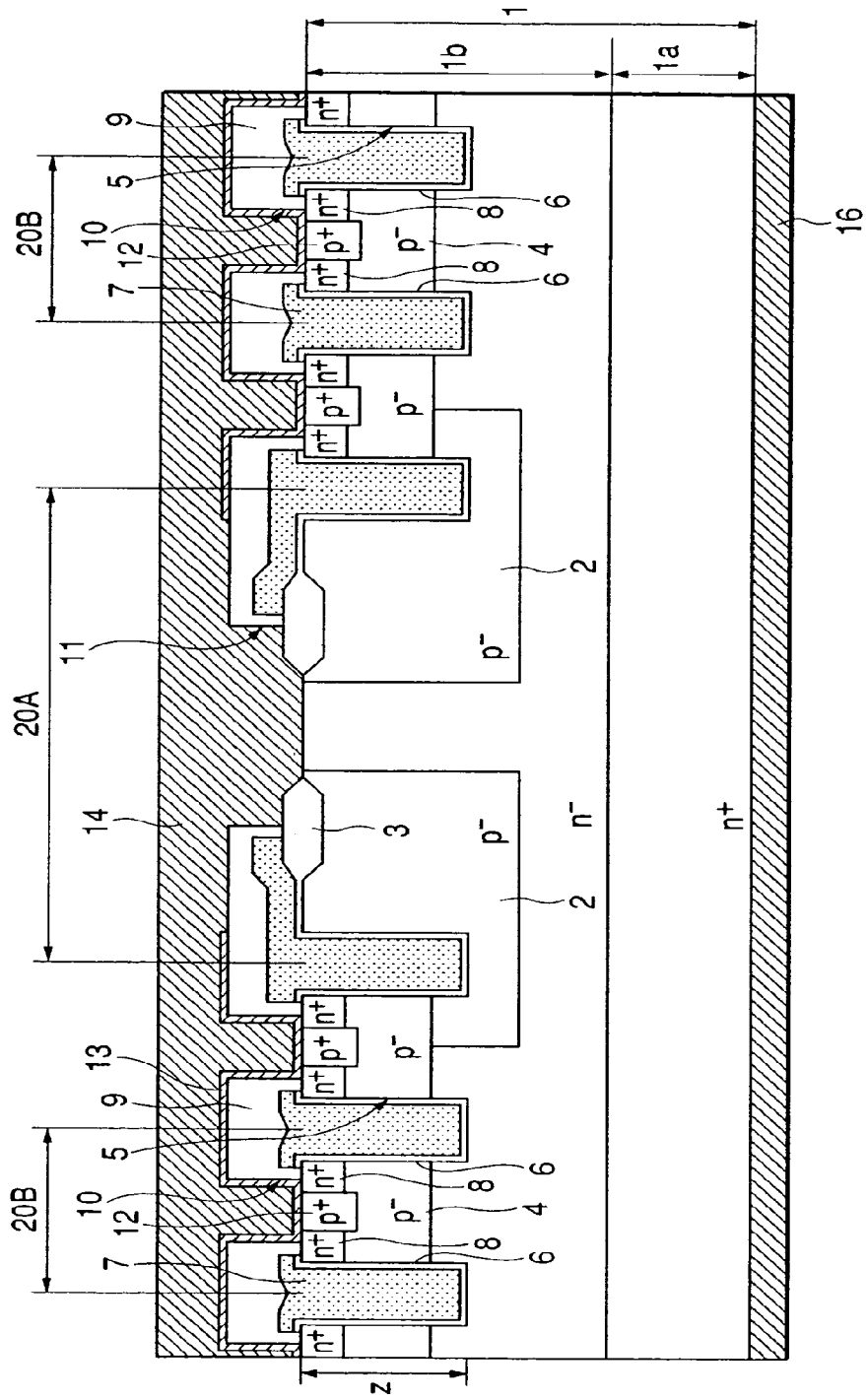
FIG. 14 is a schematic sectional view showing a schematic construction of a semiconductor device according to a fifth embodiment of the present invention.

FIG. 14 is a schematic sectional diagram showing a schematic construction of a semiconductor device according to a fifth embodiment of the present invention.

As shown in FIG. 14, the semiconductor device of this fifth embodiment is basically the same in construction as the second embodiment and is different in the following constructional point.

The metal joined to the semiconductor in the Schottky cell 20A and the metal joined to the semiconductor in each transistor cell 20B are different from each other, and a barrier height $q^*\Phi B$ of the metal junction in the Schottky cell 20A is larger than the barrier height $q^*\Phi B$ of the metal junction in the transistor cell 20B. In this fifth embodiment, an electrode 14 formed of aluminum (Al) or an aluminum alloy for example is joined to the Schottky cell 20A, while a metal film 13 formed of titanium-tungsten (TiW) is joined to the transistor cell 20B.

In the power MISFET containing a Schottky barrier diode, an electric current of several amperes is allowed to flow, so a Schottky barrier diode having a large area is required, but there is a fear of leakage current with an increase in area of the Schottky barrier diode. Therefore, using different metals, the barrier height $q^*\Phi B$ of the metal junction in the Schottky cell 20A is made larger than the barrier height $q^*\Phi B$ of the metal junction in the transistor cell 20B, whereby it is possible to diminish the leakage current.

Generally, for electrons, the barrier height is represented as $q^*\Phi B$, where q stands for a charge quantity of electron and $\Phi B = \Phi M - \chi$, wherein $\Phi M$ stands for a work function of metal and $\chi$ stands for an electron affinity.

The barrier height $q^*\Phi B$ of the metal junction in the Schottky cell 20A can be made larger than the barrier height $q^*\Phi B$ of the metal junction in the transistor cell 20B by using a metal in the junction of the Schottky cell 20A which metal is higher in work function $\Phi M$ than the metal joined to the transistor cell 20B. In this embodiment, Al or Al alloy is used for junction to the Schottky cell 20A, while TiW is used for junction to the transistor cell 20B, the Al or Al alloy being higher in work function $\Phi M$ than TiW.

(Sixth Embodiment)

Figure 15:
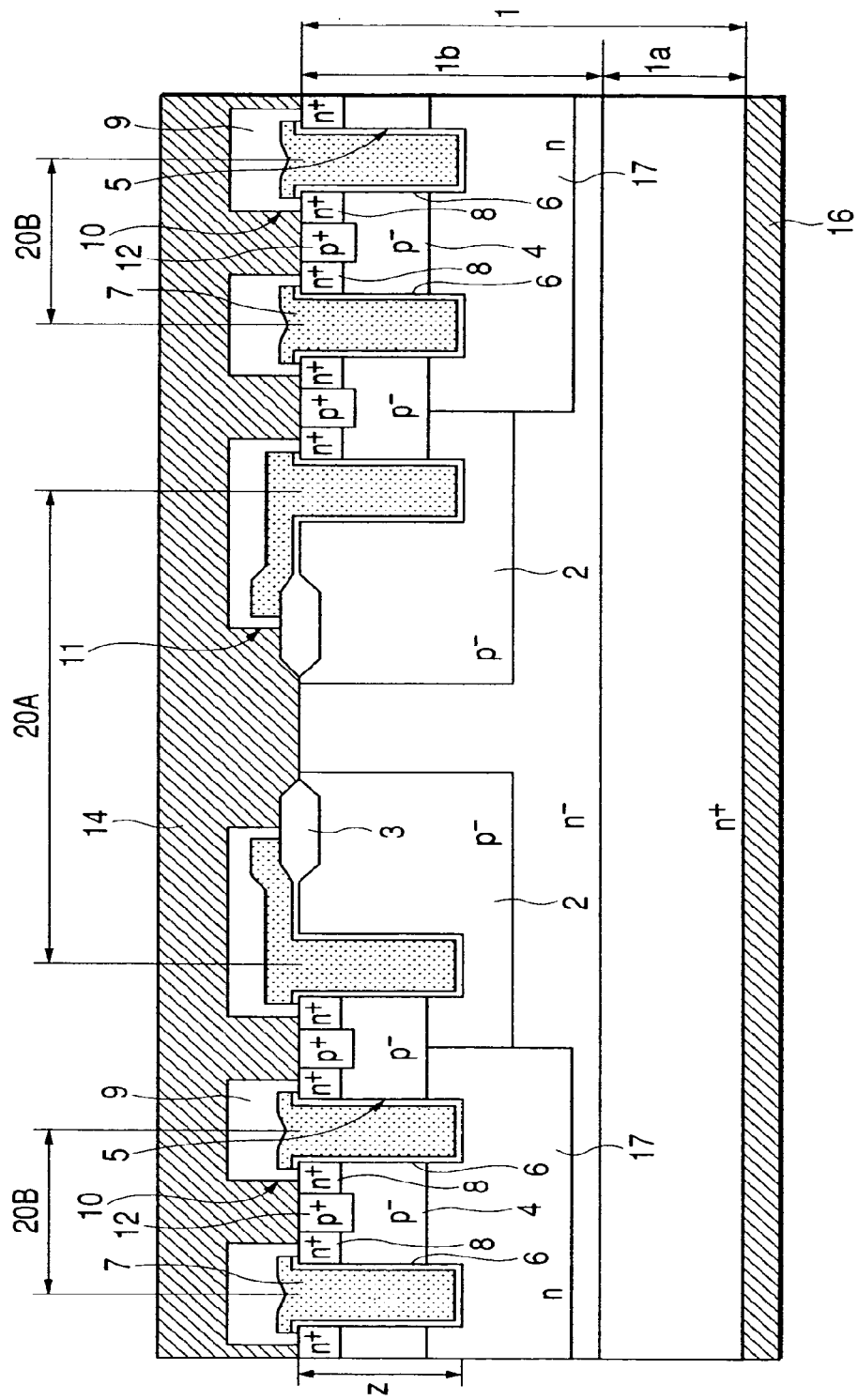
FIG. 15 is a schematic sectional view showing a schematic construction of a semiconductor device according to a sixth embodiment of the present invention.

FIG. 15 is a schematic sectional diagram showing a schematic construction of a semiconductor device according to a sixth embodiment of the present invention.

As shown in FIG. 15, a Schottky barrier diode in a

Schottky cell 20A is formed by Schottky junction of an n⁻ type semiconductor region 1b and an electrode 14. MISFET drain region in each transistor cell 20B is constituted by an n type semiconductor region (well region) 17 and an n⁺ type semiconductor layer 1a, the n type semiconductor region 17 being formed in the n⁻ type semiconductor layer 1b in contact with a p⁻ type semiconductor region 4 as a channel forming region. The n type semiconductor region 17 is formed at an impurity concentration lower than that of the n⁺ type semiconductor substrate 1a and higher than that of n⁻ type semiconductor layer 1b. That is, the MISFET drain region is set so that the impurity concentration on the channel forming region side is higher than that of the n⁻ type semiconductor layer 1b.

Since the breakdown voltage of the power MISFET is a pn junction breakdown voltage between the p⁻ type semiconductor region 4 as the channel forming region and the drain region, a depletion layer extends to both p and n type regions. On the other hand, since the breakdown voltage of the Schottky barrier diode is a Schottky junction breakdown voltage between metal and n type cathode region, a depletion layer extends to only the n type cathode region. Therefore, if both power MISFET and Schottky barrier diode are formed in n type regions of the same impurity concentration, the latter is sure to become lower in breakdown voltage.

If the breakdown voltage of the Schottky barrier diode is lower than that of the power MISFET, there always occurs breakdown in the Schottky barrier diode, thus resulting in deterioration of the reliability. In the case where the power MISFET is lower in breakdown voltage, there occurs breakdown in the pn junction within the bulk, a variation of characteristic is difficult to occur. On the other hand, if the Schottky barrier diode is lower in breakdown voltage, since it is an interface device, a variation of characteristic is apt to occur due to carriers generated upon breakdown.

Such a problem can be solved by making the n type cathode region in the Schottky barrier diode lower in impurity concentration than the n type drain region in MISFET. With such a construction, it is possible to make the breakdown voltage of the power MISFET low and that the Schottky barrier diode high.

Although in this embodiment reference has been made to an example of applying the present invention to the semiconductor device having the power MISFET of a trench gate structure and the Schottky barrier diode, the present invention is also applicable to a semiconductor device having a power MISFET of a planar structure and a Schottky barrier diode and a semiconductor device having a power MISFET of an LD (Lateral Double Diffusion Self-aligned) structure and a Schottky barrier diode.

(Seventh Embodiment)

Figure 16:
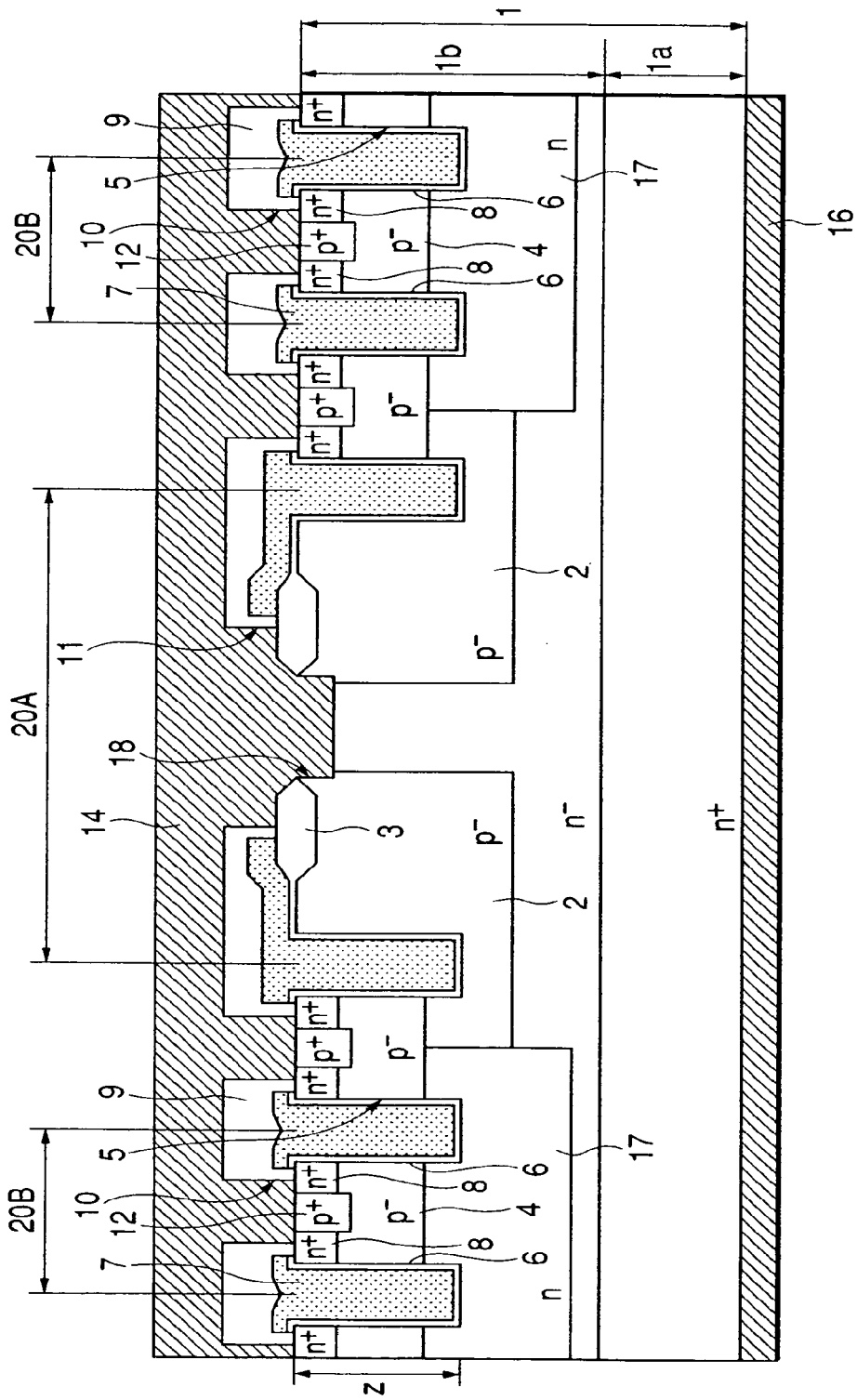
FIG. 16 is a schematic sectional view showing a schematic construction of a semiconductor device according to a seventh embodiment of the present invention.

FIG. 16 is a schematic sectional diagram showing a schematic construction of a semiconductor device according to a seventh embodiment of the present invention.

As shown in FIG. 16, a metal junction in a Schottky barrier diode in a Schottky cell 20A is carried out at a bottom portion of a trench 18 formed in one main surface of a semiconductor substrate 1. An n⁻ type semiconductor layer 1b with phosphorus (P) introduced therein becomes higher in density than in the initial state due to surface-segregation of phosphorus in the thermal oxidation step. The trench 18 is formed by digging down the surface portion which has become high in density by the segregation, and in the interior bottom portion of the trench 18 there is performed metal junction of the Schottky barrier diode in the Schottky cell 20A, whereby the Schottky barrier diode can be made higher in breakdown voltage.

(Eighth Embodiment)

In this embodiment a description will be given below of an example in which the present invention is applied to a semiconductor device having a power MISFET of a planar structure and a Schottky barrier diode.

Figure 17:
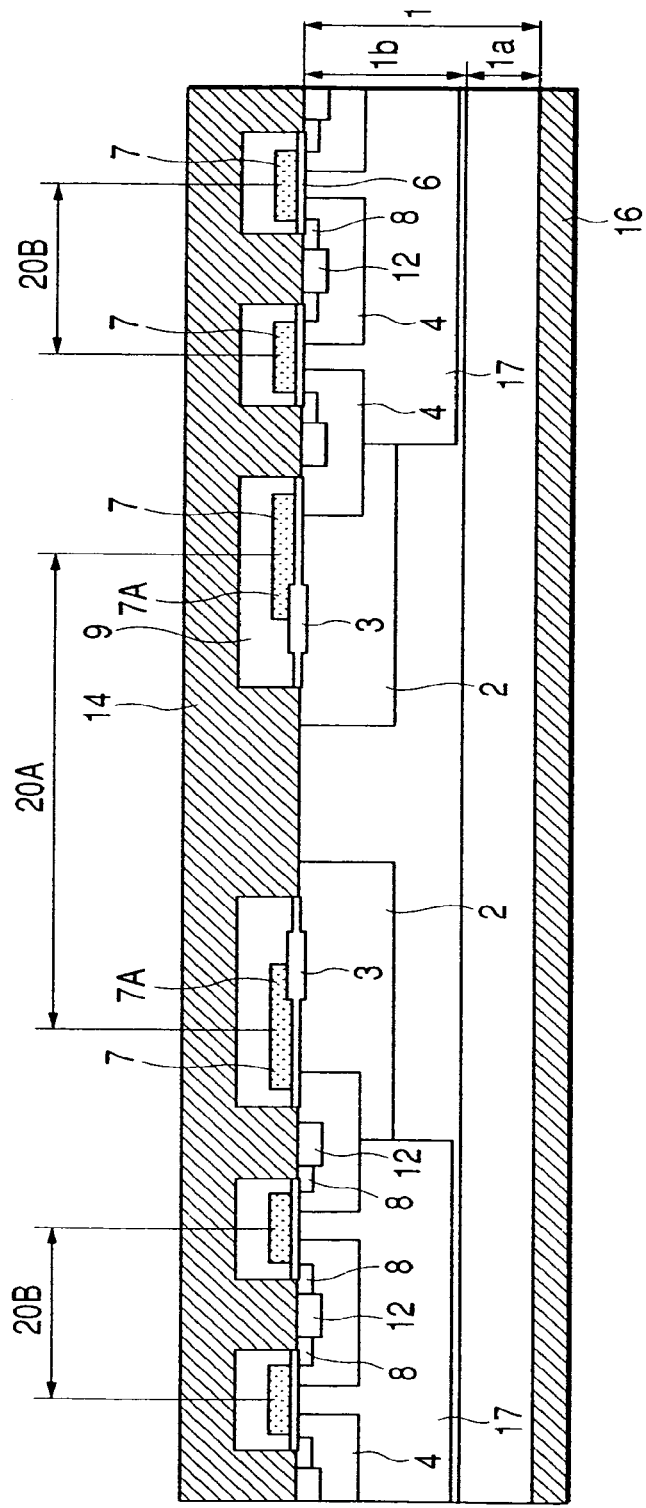
FIG. 17 is a schematic sectional view showing a schematic construction of a semiconductor device according to an eighth embodiment of the present invention.

FIG. 17 is a schematic sectional diagram showing a schematic construction of a semiconductor device according to an eighth embodiment of the present invention.

As shown in FIG. 17, the semiconductor device of this eighth embodiment is of basically the same construction as the sixth embodiment and is different in the following constructional point.

In a transistor cell 20B, a MISFET has a gate electrode 7 which is disposed on a main surface of a semiconductor substrate 1 (main surface of an n⁻ type semiconductor layer 1b) through a gate insulating film 6.

Also in such a semiconductor device having a power MISFET of a planar structure and a Schottky barrier diode, by making the n type cathode region in the Schottky barrier diode lower in impurity concentration than the n type drain region in the MISFET as in the sixth embodiment, it is possible to make the breakdown voltage of the power MISFET low and that of the Schottky barrier diode high.

(Ninth Embodiment)

In this embodiment, an example of applying the present invention to a semiconductor device having a power MISFET of a lateral double diffusion self-aligned structure and a Schottky barrier diode will be described.

Figure 18:
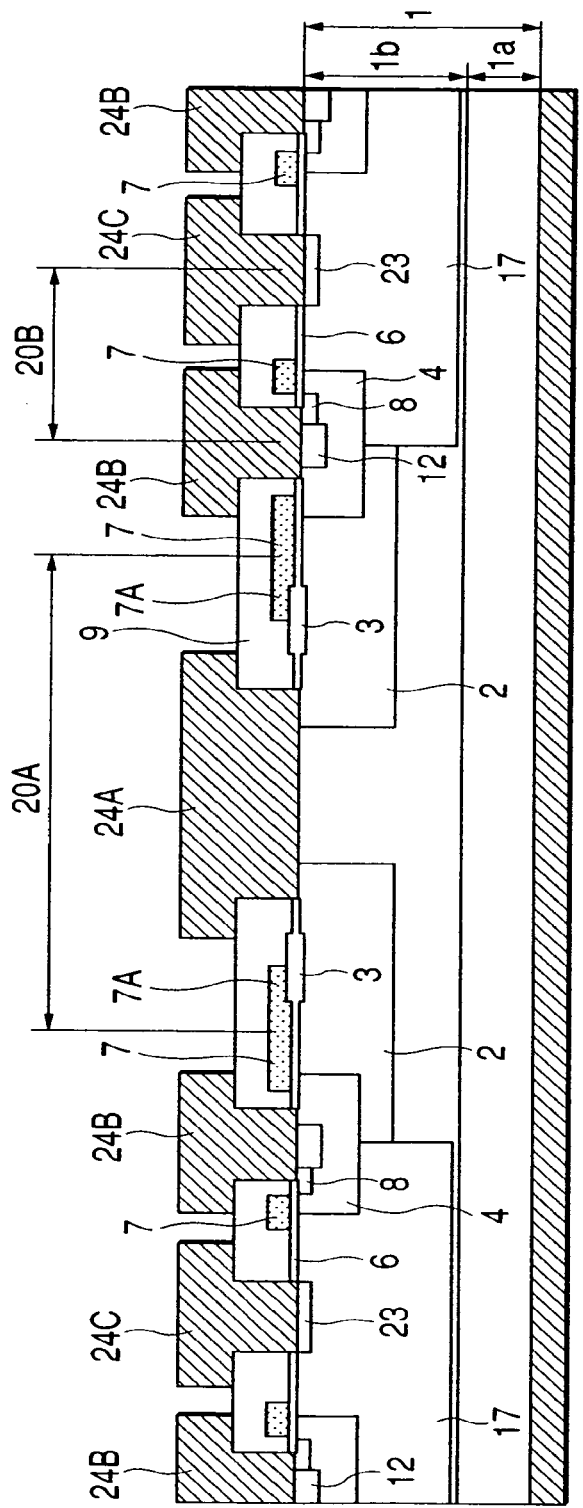
FIG. 18 is a schematic sectional view showing a schematic construction of a semiconductor device according to a ninth embodiment of the present invention.

FIG. 18 is a schematic sectional diagram showing a schematic construction of a semiconductor device according to a ninth embodiment of the present invention.

As shown in FIG. 18, a Schottky barrier diode in a Schottky cell is formed by Schottky junction of an n⁻ type semiconductor layer 1b and an electrode 24A. A MISFET in a transistor cell has a lateral structure wherein an electric current flows in a surface direction of a semiconductor substrate 1.

The MISFET in the transistor cell mainly comprises a channel forming region, a gate insulating film 6, a gate electrode 7, a source region, and a drain region. The channel forming region is formed by a p⁻ type semiconductor region 4 provided on a main surface of an n⁻ type semiconductor layer 1b. The gate insulating film 6 is formed on the main surface of the n⁻ type semiconductor layer 1b in opposition to the channel forming region. The gate electrode 7 is formed on the main surface of the n⁻ type semiconductor layer 1b through the gate insulating film 6. The source region is formed by an n⁺ type semiconductor region 8 which is formed in a surface portion of the p⁻ type semiconductor region 4 in contact with the region 4. The drain region is composed of the n type semiconductor region 17 which is provided in the n⁻ type semiconductor layer 1b in contact with the p– type semiconductor region 4 as a channel forming region and an n⁺ type semiconductor region 23 provided in the n type semiconductor region 17 spacedly from the p⁻ type semiconductor region 4. The n type semiconductor region 17 is formed at an impurity concentration lower than that of the n⁺ type semiconductor region 23 and higher than that of the n⁻ type semiconductor layer 1b. Thus, also in the MISFET of this embodiment, the impurity concentration on the channel forming region side of the drain region is set higher than that of the n⁻ type semiconductor layer 1b.

A p⁺ type semiconductor region 12 is formed in a main surface of the p⁻ type semiconductor region 4, and a source electrode 24B is electrically connected to both p⁺ type semiconductor region 12 and n⁺ type semiconductor region 8 through a connecting hole formed in an interlayer insulating film 9. Thus, in the MISFET in each transistor cell, the source region and the channel forming region are fixed to the same potential.

A drain electrode 24C is electrically connected to the n⁺ type semiconductor region 23 through a connecting hole formed in the interlayer insulating film 9. In the Schottky cell, an electrode 24A is electrically connected to the n⁻ type semiconductor layer 1b through a connecting hole formed in the interlayer insulating film 9.

The Schottky barrier diode in the Schottky cell is formed by Schottky connection between the n⁻ type semiconductor layer 1b and the electrode 24A. On the other hand, the transistor cell MISFET is higher in impurity concentration in the channel forming side of its drain region than the n⁻ type semiconductor layer 1b. That is, in this embodiment, the cathode region in the Schottky barrier diode is lower in impurity concentration than the channel forming region side of the MISFET drain region, so the breakdown voltage of the Schottky barrier diode can be made higher than that of the power MISFET as in the sixth embodiment.

Although in each of the semiconductor devices described in the above first to fifth embodiments both power MISFET of a trench gate structure and Schottky barrier diode are mounted on one and the same substrate, the invention carried out in the first to fifth embodiments is also applicable to a semiconductor device having a power MISFET of a planar structure and a Schottky barrier diode and a semiconductor device having a power MISFET of lateral double diffusion self-aligned structure and a Schottky barrier diode.

Although the present invention has been described above concretely on the basis of the above embodiments, it goes without saying that the invention is not limited to those embodiments, but that various changes may be made within the scope not departing from the gist of the invention.

The following is a brief description of effects obtained by typical inventions disclosed herein.

According to the present invention it is possible to attain the reduction in size of a semiconductor device having both power transistor and Schottky barrier diode on one and the same semiconductor substrate.

According to the present invention it is possible to ensure the freedom of design in a semiconductor device having both power transistor and Schottky barrier diode on one and the same semiconductor substrate.

According to the present invention it is possible to enhance the breakdown voltage of a Schottky barrier diode in a semiconductor device having both power transistor and Schottky barrier diode on one and the same semiconductor substrate.

According to the present invention it is possible to enhance the breakdown voltage (source-drain breakdown voltage) of a power transistor in a semiconductor device having both power transistor and Schottky barrier diode on one and the same semiconductor substrate.

What is claimed is:

1. A semiconductor device including a MOSFET, comprising:
   a semiconductor substrate having a main surface and a back surface opposite to the main surface;
   the semiconductor substrate having a plurality of transistor cell regions, each of the plurality of transistor cell regions including:
      a plurality of trenches disposed in the semiconductor substrate;
      a well region, in which a channel of the MOSFET is formed, disposed between the plurality of trenches;
      a gate insulating film of the MOSFET disposed in each of the plurality of trenches;
      a gate electrode of the MOSFET disposed over the gate insulating film in each of the plurality of trenches; and
      a source region of the MOSFET disposed in the well region;
   a source electrode of the MOSFET disposed over the main surface of the semiconductor substrate and being in contact with a top surface of the source region in each of the plurality of transistor cell regions;
   a drain electrode of the MOSFET disposed over the back surface of the semiconductor substrate and electrically connected to the semiconductor substrate; and
   a Schottky cell region disposed between the plurality of transistor cell regions in the semiconductor substrate;
   wherein the source electrode is in contact with a part of the main surface of the semiconductor substrate so as to form a Schottky junction in the Schottky cell region, and
   wherein the Schottky junction is lower than a portion of the main surface between the Schottky junction and one of the transistor cell regions.

2. A semiconductor device according to claim 1,
   wherein the semiconductor substrate and the source region have a first conductivity type, and
   the well region has a second conductivity type which is opposite to the first conductivity type.

3. A semiconductor device according to claim 2, wherein the first and second conductivity types are n-type and p-type, respectively.

4. A semiconductor device according to claim 3, wherein the semiconductor substrate includes phosphorous.

5. A semiconductor device according to claim 1,
   wherein a plurality of field insulating films are disposed on the main surface of the semiconductor substrate in the Schottky cell region,
   at least part of the source electrode is located over the field insulating films, and
   the Schottky junction is formed between the field insulating films in plan view.

6. A semiconductor device according to claim 1, wherein the source electrode is comprised of aluminum.

7. A semiconductor device with a MOSFET and a Schottky barrier diode (SBD), the MOSFET having a gate, a drain region and a source region, and the SBD having an anode coupled the source region of the MOSFET and a cathode coupled to the drain region of the MOSFET, the semiconductor device comprising:
   a semiconductor substrate having a main surface and a back surface opposite to the main surface;
   the semiconductor substrate having a transistor cell region where the MOSFET is formed;
   a source electrode coupled to the source region of the MOSFET and disposed over the main surface of the semiconductor substrate;
   a drain electrode coupled to the drain region of the MOSFET, disposed over the back surface of the semiconductor substrate, and electrically coupled to the semiconductor substrate;
   the semiconductor substrate having a Schottky cell region where the SBD is formed; and
   wherein the source electrode is in contact with a part of the main surface of the semiconductor substrate so as to form a Schottky junction of the SBD in the Schottky cell region, and
   wherein the Schottky junction is located lower than a portion of the main surface between the Schottky cell region and the transistor cell region.

8. A semiconductor device according to claim 7, wherein the transistor cell region includes:
   a plurality of trenches disposed in the semiconductor substrate;
   a well region, in which a channel of the MOSFET is formed, disposed between the plurality of trenches;
   a gate insulating film of the MOSFET disposed in each of the plurality of trenches;
   a gate electrode of the MOSFET disposed over the gate insulating film in each of the plurality of trenches; and
   the source region of the MOSFET disposed in the well region.

9. A semiconductor device according to claim 8, wherein the source electrode is in contact with a top surface of the source region in the transistor cell region.

10. A semiconductor device according to claim 9,
wherein the semiconductor substrate and the source region have a first conductivity type, and
the well region has a second conductivity type which is opposite to the first conductivity type.

11. A semiconductor device according to claim 10, wherein the first and second conductivity types are n-type and p-type, respectively.

12. A semiconductor device according to claim 11, wherein the semiconductor substrate includes phosphorous.

13. A semiconductor device according to claim 9,
wherein a plurality of field insulating films are disposed on the main surface of the semiconductor substrate in the Schottky cell region,
at least part of the source electrode is located over the field insulating films, and
the Schottky junction is formed between the field insulating films in plan view.

14. A semiconductor device according to claim 9, wherein the source electrode is comprised of aluminum.

* * * * *